(12) United States Patent
Tham

(10) Patent No.: US 8,884,713 B2
(45) Date of Patent: Nov. 11, 2014

(54) METHOD AND APPARATUS OF CANCELLING INDUCTOR COUPLING

(75) Inventor: KhongMeng Tham, San Diego, CA (US)

(73) Assignee: Tensorcom, Inc., Carlsbad, CA (US)

(*) Notice: Subject to any disclaimer, the term of this patent is extended or adjusted under 35 U.S.C. 154(b) by 42 days.

(21) Appl. No.: 13/474,742

(22) Filed: May 18, 2012

(65) Prior Publication Data

US 2013/0307613 A1    Nov. 21, 2013

(51) Int. Cl.
*H03B 5/08*    (2006.01)

(52) U.S. Cl.
USPC .... 331/167; 331/48; 331/117 R; 331/117 FE; 455/260; 455/255; 455/326; 455/78; 375/219

(58) Field of Classification Search
CPC ............... H03B 1/00; H03B 5/08; H03B 5/10
USPC ............ 332/138, 141; 455/260, 78, 255, 326; 331/48, 167, 117 R, 117 FE; 375/219
See application file for complete search history.

(56) References Cited

U.S. PATENT DOCUMENTS

| | | | |
|---|---|---|---|
| 7,881,677 B2 * | 2/2011 | Marholev et al. | 455/78 |
| 8,139,625 B2 * | 3/2012 | Voinigescu et al. | 375/219 |
| 2012/0182078 A1 * | 7/2012 | Lee et al. | 331/48 |

OTHER PUBLICATIONS

47 CFR § 15.255 Operation within the band 57-64 GHz; copied from "http://www.gpo.gov/fdsys/pkg/CFR-2012-title47-vol1/pdf/CFR-2012-title47-vol1-sec15-255.pdf" on Jul. 18, 2012.

* cited by examiner

*Primary Examiner* — Arnold Kinkead
(74) *Attorney, Agent, or Firm* — Thaddeus Gabara; Tyrean Patent Prosecution Law Firm

(57) ABSTRACT

This invention compensates for the unintentional magnetic coupling between a first and second inductor of two different closely spaced inductors separated by a conversion circuit. A cancellation circuit formed from transistors senses the magnetic coupling in the first inductor and feeds a current opposite to the induced magnetic coupling captured by the second inductor such that the coupled magnetic coupling can be compensated and allows the first and second inductors to behave independently with regards to the coupled magnetic coupling between the first and second inductors. This allows the distance between the first and second inductors to be minimized which saves silicon area. In addition, the performance is improved since the overall capacitance in both circuits can be decreased. This cancellation technique to reduce the magnetic coupling between two closed placed inductively loaded circuits allows the design of a more compact and faster performing circuit.

16 Claims, 18 Drawing Sheets

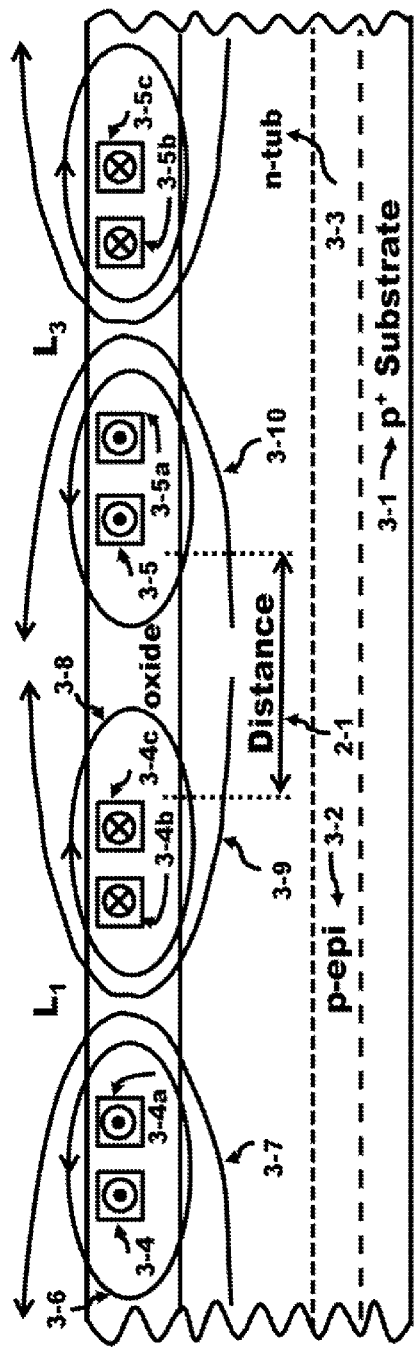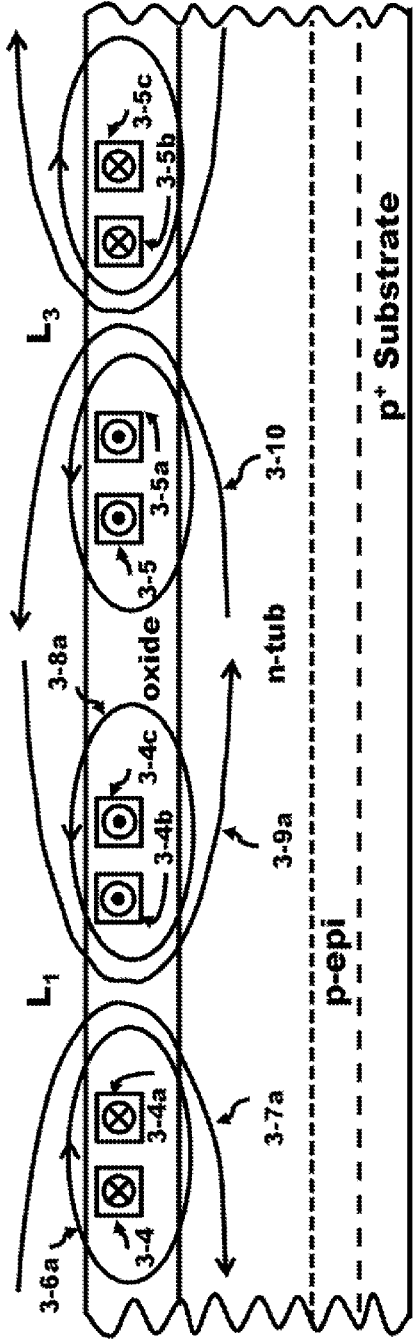
FIG. 3a
FIG. 3b

METHOD AND APPARATUS OF CANCELLING INDUCTOR COUPLING

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs. Since WiGig transceivers use carrier frequencies in the range of 60 GHz, the electromagnetic field of an inductor can transfer these high frequency signals into other circuit components of the system design causing undesirable effects. These effects can impact the performance and behavior of receiver and transmitter units. The undesirable coupling of the inductor's electromagnetic field needs to be carefully monitored and minimized, if possible, to reduce these undesirable effects.

CMOS (Complementary Metal Oxide Semiconductor) is the primary technology used to construct integrated circuits. N-channel devices and P-channel devices (MOS device) are used in this technology which uses fine line technology to consistently reduce the channel length of the MOS devices. Current channel lengths examples are 40 nm, the power supply of VDD equals 1.2V and the number of layers of metal levels can be 8 or more. This technology typically scales with technology.

CMOS technology delivers a designer with the ability to form very large system level design on one die known as a System On a Chip (SOC). The SOC are complex systems with millions, if not billions, of transistors which contain analog circuits and digital circuits. The analog circuits operate purely analog, the digital circuits operate purely digital and these two circuits types can be combined together to form circuits operating in a mixed-signal.

For example, digital circuits in their basic form only use digital logic and some examples can be a component comprising at least one; processor, memory, control logic, digital I/O circuit, reconfigurable logic and/or hardware programmed that to operate as hardware emulator. Analog circuits in their basic form only use only analog circuits and some examples can be a component comprising at least one; amplifier, oscillator, mixer, and/or filter. Mixed signal in their basic form only use both digital and analog circuits and some examples can be a component comprising at least one: DAC (Digital to Analog Convertor), Analog to Digital Converter (ADC), Power Supply control, Phase Lock Loop (PLL), and/or device behavior control over Process, Voltage and Temperature (PVT). The combination of digital logic components with analog circuit components can appear to behave like mixed signal circuits; furthermore, these examples that have been provided are not exhaustive as one knowledgeable in the arts understands.

The SOC can generate a large amount of inductive noise that couples through parasitic reactances formed between the metal layers of closely packed inductors and could become a hostile environment for critical analog circuits. Analog designers attempt to minimize this form of noise coupling using any know means in the art, if possible.

Transceivers comprise at least one transmitter and at least one receiver and are used to interface to other transceivers in a communication system. One version of the transmitter can comprise at least one of each: DAC, LPF (Low Pass Filter), mixer, local oscillator, power amplifier and interface port that are coupled forming a RF (Radio Frequency) transmit chain. One version of the receiver can comprise at least one of each: interface port, LNA (Low Noise Amplifier), mixer, BB (Base Band) amplifier, LPF and ADC that are coupled forming a RF receive chain. Furthermore, each RF transmit and receive chains can operate on an in-phase (I) signal and the quadrature-phase (Q) signal simultaneously.

One of the critical design parameters of a transceiver occurs between the coupling of magnetic flux between inductors between different sections of the transmit chain. Various methods and circuits as are well known in the art can be used to minimize the magnetic coupling, for example, by increasing the physical displacement of the inductors from one another. However, the increased distance between the inductors introduces additional capacitance which reduces the bandwidth of the transceiver, causes valuable real estate of silicon area to be used and requires extra power consumption to drive the larger capacitive loads. Another solution to overcome this problem is required.

BRIEF SUMMARY OF THE INVENTION

In accordance with one aspect of the invention, a cancellation circuit is used to compensate for the magnetically induced signals between an inductor of a quadrature oscillator and another inductor powering an adjacent conversion circuit. The introduction of this cancellation circuit reduces the requirement for these circuit elements to be placed far apart so that their magnetic coupling interaction is reduced. The cancellation circuit compensates for the induced magnetic coupling between these two inductors. This allows the transceiver to be placed in compact area saving valuable silicon area.

In another illustrative embodiment, the magnetic coupling between a first inductor of a quadrature oscillator and the second inductor of a mixers and a summer are compensated by a transistor circuit which introduces a current to compensate for the effective magnetic coupling of the first inductor in the quadrature oscillator has on the second inductor. The transistors compensate for the coupled magnetic flux intercepted by the second inductive components of the mixers and summer by applying a compensating current to the second inductor to reduce the effective coupled magnetic flux captured by the second inductor. Thus, the second inductor behaves as if there was no magnetic flux coupled from the first inductor of the oscillator.

Additionally, in another illustrative embodiment, the non-uniform transfer response of the circuit with only the I channel or Q channel in operation without the cancellation circuit demonstrates the unequal magnetic coupling between the first and second inductive components of the magnetically coupled circuit. The transfer curve of the mixers and the summer when the cancellation circuit is enabled with both I and Q channels in operation demonstrates that the transfer response of the coupling is very uniform over frequency. This indicates that the cancellation circuit compensates for the magnetically coupled signal between the first and second inductors separated by the conversion circuit.

Another embodiment of one of the present inventions is an apparatus comprising: a quadrature oscillator coupled to a power supply by two or more inductors; a conversion circuit coupled to said power supply by another two or more inductors; a magnetic coupling between said two or more inductors and said another two or more inductors; a cancellation circuit responsive to clock signals of said quadrature oscillator; and said cancellation circuit coupled to said conversion circuit and said another two or more inductors to compensate for said magnetic coupling, further comprising: a differential current output of said cancellation circuit introduced into said another two or more inductors that cancels out said magnetic coupling, further comprising: a differential input signal coupled to said conversion circuit, further comprising: two or more mixers coupled to a summer in said conversion circuit which up-converts said differential input signal to a differential RF signal. The apparatus further comprising: a load coupled to said conversion circuit, further comprising: a power amplifier in said load amplifying said differential RF signal, further comprising: cross coupled circuits in said quadrature oscillator.

Another embodiment of one of the present inventions is an apparatus comprising: a source circuit coupled to a power supply by at least one inductor; a conversion circuit coupled to said power supply by at least one other inductor; a magnetic coupling between said one inductor and said other inductor: a cancellation circuit responsive to at least one output signal from said source circuit: and said cancellation circuit coupled to said other inductor to compensate for said magnetic coupling, further comprising: a current output of said cancellation circuit introduced into said other inductor that cancels said magnetic con between said one inductor said other inductor, further comprising: a differential clock circuit; a differential amplifier or a second mixer in said source circuit driven by a first differential input signal, further comprising: a second differential input signal coupled to said conversion circuit, further comprising: at least one mixer coupled to a summer in said conversion circuit which either up-converts or down converts said second differential input signal to a differential RE signal or differential IF signal, respectively. The apparatus further comprising: a load coupled to said conversion circuit, further comprising: an amplifier of said load amplifying said differential RE signal or said differential IF signal.

Another embodiment of one of the present inventions is a method of compensating for a magnetic coupling comprising the steps of: generating signals from a quadrature oscillator coupled to a power supply by two or more inductors: coupling a conversion circuit to said power supply by another two or more inductors: magnetically coupling said two or more inductors to said another two or more inductors: applying said signals from said quadrature oscillator to a cancellation circuit: and compensating for said magnetic coupling by coupling a differential current of said cancellation circuit to said another two or more inductors, further comprising the steps of: mixing differential baseband signals with said signals from said quadrature oscillator, further comprising the steps of: summing said mixed differential baseband signals. further comprising the steps of applying said summed differential signal to said another two or more inductors, further comprising the steps of: adding differential currents of said cancellation circuit to said summed differential signal to cancel said magnetic coupling, further comprising the steps of: amplifying said summed differential signal with a power amplifier.

BRIEF DESCRIPTION OF THE DRAWINGS

Please note that the drawings shown in this specification may not be drawn to scale and the relative dimensions of various elements in the diagrams are depicted schematically and not to scale.

FIG. 3a illustrates the cross-sectional view of FIG. 2a in accordance with the present invention.

FIG. 3b shows the cross-sectional view of FIG. 2b in accordance with the present invention.

DETAILED DESCRIPTION OF THE INVENTION

This invention has been incorporated into the transceiver design for a 60 GHz wireless system. The inventive apparatus is applicable to any high frequency system, for example, where the coupling inductance of a metallic trace in a first circuit can influence the inductance behavior of a second circuit having a metal trace intercepting the magnetic coupling of the first inductor. This invention reduces the undesirable "inductive coupling," between the inductors of two different circuits.

Figure 1A:
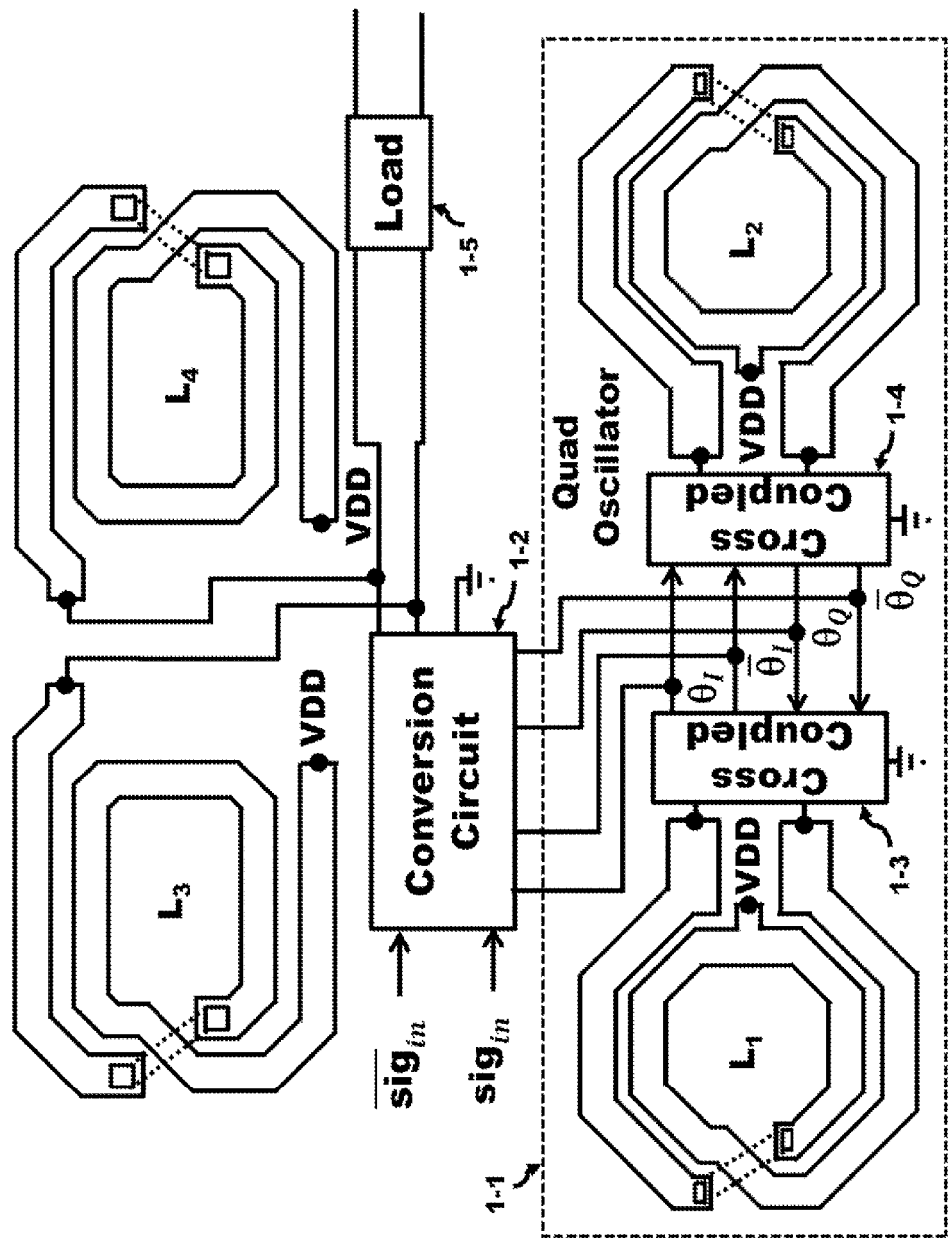
FIG. 1a depicts a block diagram of the quadrature oscillator, conversion circuit, load and inductor placement in accordance with the present invention.

FIG. 1a illustrates a block diagram with the approximate inductor layout of a quadrature oscillator 1-1 containing the first cross coupled circuit 1-3 and a second cross coupled circuit 1-4. Both cross coupled circuits are coupled to a power supply, in this case VDD, by the inductors $L_1$ and $L_2$. The two cross coupled circuits are each coupled to the center tapped inductor $L_1$ and inductor $L_2$, respectively. The quadrature oscillator generates four clock output signals. The first and second clock signal is a differential clock output and includes the $\Theta_I$ and its differential signal (180° out of phase signified by the bar over the symbol). The third and fourth clock signal is a differential clock output and includes the $\Theta_Q$ and its differential signal. The $\Theta_I$ and the $\Theta_Q$ are separated by 90°, and applied to the conversion circuit 1-2. The conversion circuit 1-2 also receives an input signal, $sig_{in}$, and its differential signal. The conversion circuit is coupled to a power supply, in this case VDD, by the two inductors $L_3$ and $L_4$. The two output leads of the conversion circuit provide a differential output signal to the load 1-5. The conversion circuit 1-2 can consist of any circuit driven by the outputs of a first circuit, such as a quadrature oscillator and a second differential signal $sig_{in}$ and its complement that requires conversion into another format. The converted differential signal is available at the output of the conversion circuit. One example of the converter is performing up conversions as in translating a baseband signal to an (IF) intermediate frequency or another example is translating a baseband signal to an RF signal in a homodyne system in a transmit chain. The converter can perform down conversions as well. The physical positioning of the inductors $L_1$, $L_2$, $L_3$ and $L_4$ is approximately represented as shown. The inductors are fabricated primarily in the top metal layer of the integrated circuit that includes the transceiver. The top layer of metal in a die approaches about a 1 um thickness and is usually fabricated in Cu to reduce sheet resistance and therefore resistive loss.

Figure 1B:
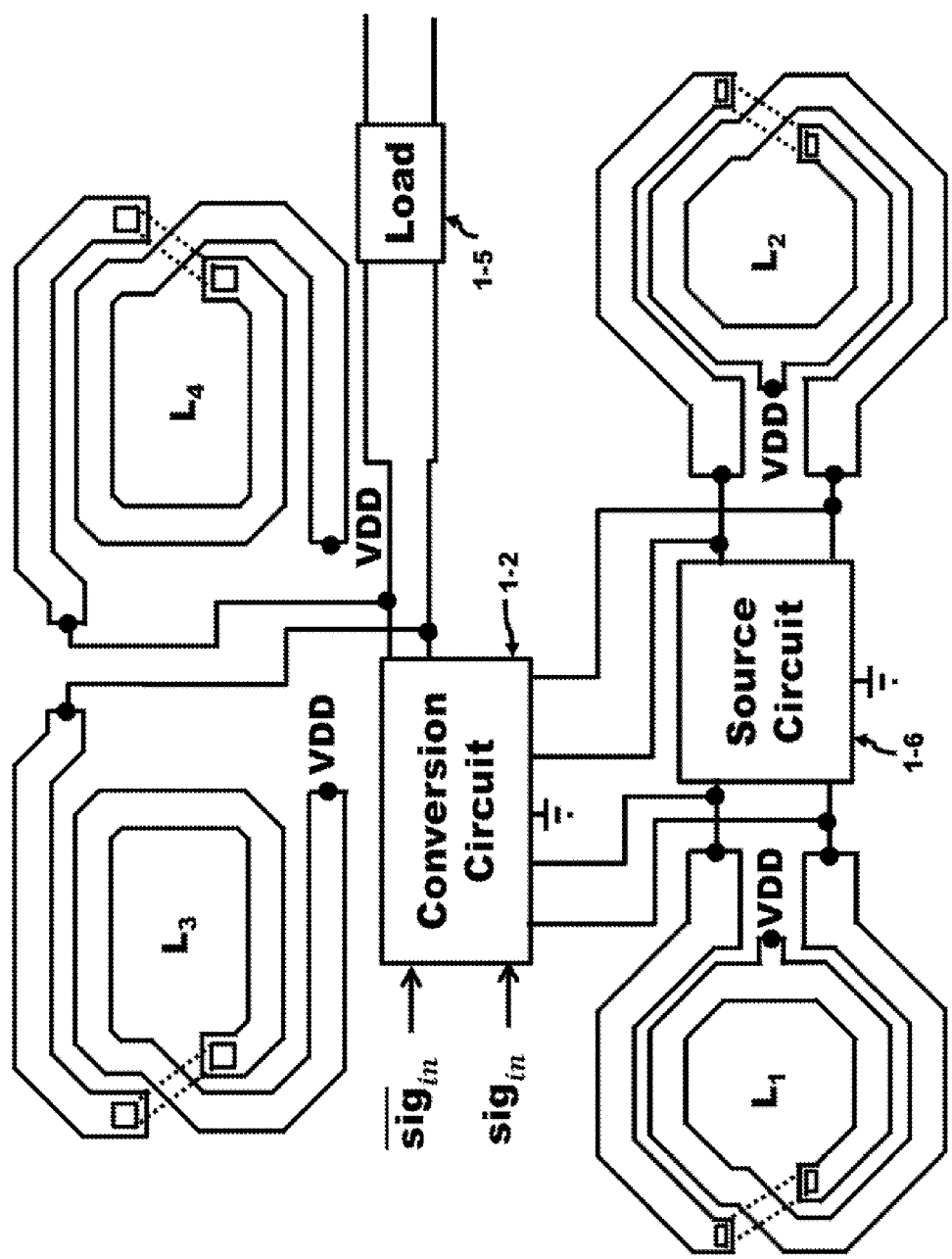
FIG. 1b shows a block diagram of the source circuit, conversion circuit, load and inductor placement in accordance with the present invention.
Figure 1C:
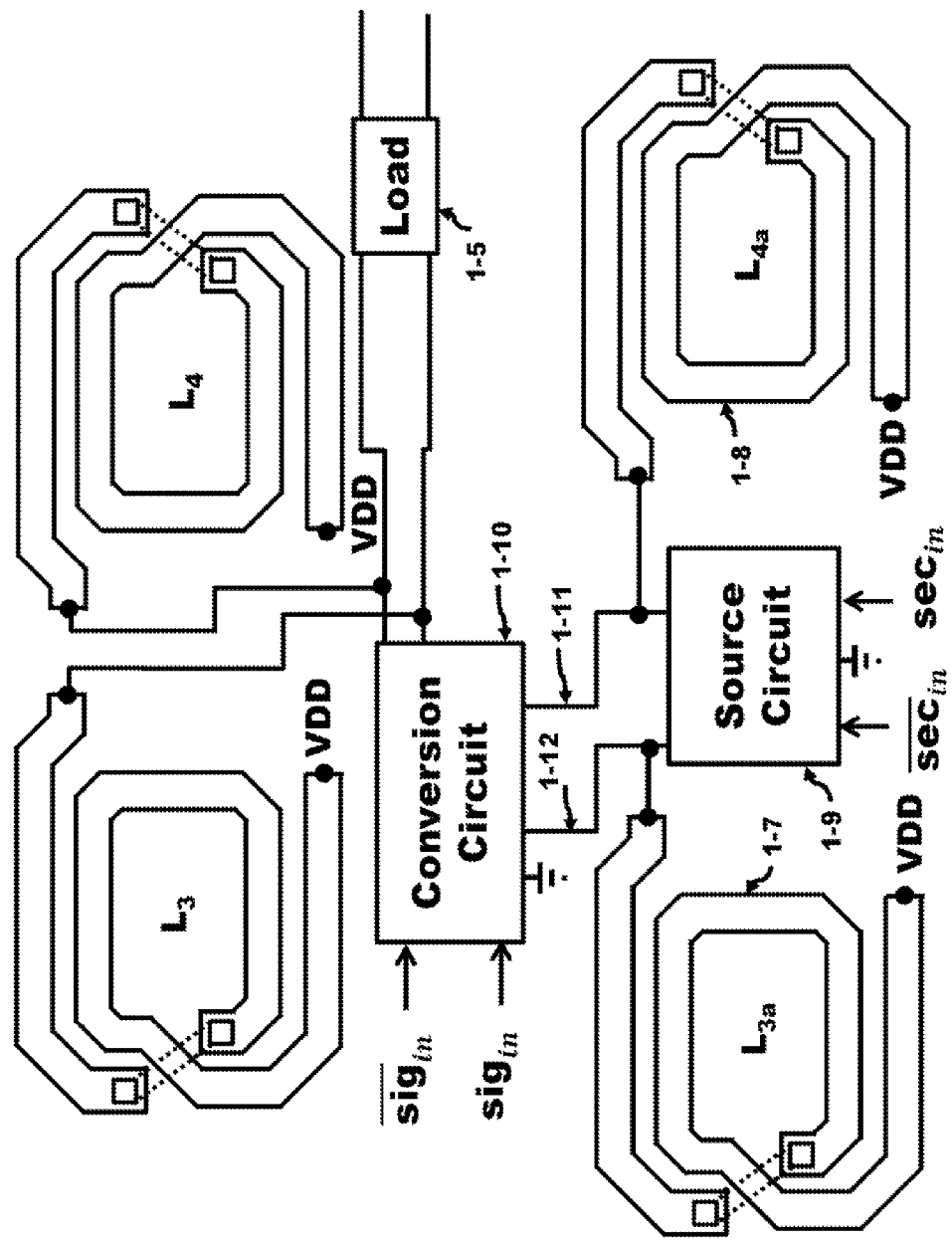
FIG. 1c presents a block diagram of the source circuit with two outputs, conversion circuit, load and inductor placement in accordance with the present invention.

FIG. 1b presents a simplified version of the circuit. The two cross coupled circuits 1-3 and 1-4 in FIG. 1a have been replaced with a source circuit 1-6. The source circuit can be a quadrature oscillator, a multi-phase clock circuit, etc. The source circuit is coupled to a power supply by the two sets of center tapped inductors $L_1$ and $L_2$. FIG. 1c illustrates yet another version of the circuit. The quadrature oscillator of FIG. 1a has been replaced by the source circuit 1-9 and the inductors $L_3a$ 1-7 and $L_4a$ 1-8 which provides only two outputs 1-11 and 1-12 instead of four. The source circuit 1-9 can be driven by a second input signal $sec_{in}$ and its compliment signal. The source circuit 1-9 is coupled to a power supply, VDD, by the inductors $L_{3a}$ and $L_{4a}$. The source circuit 1-9 can be a clock circuit, an amplifier, a second mixer, etc.

Also note that the conversion circuit 1-10 receives only two inputs 1-11 and 1-12 and the $sig_{in}$ and its compliment signal.

Figure 2A:
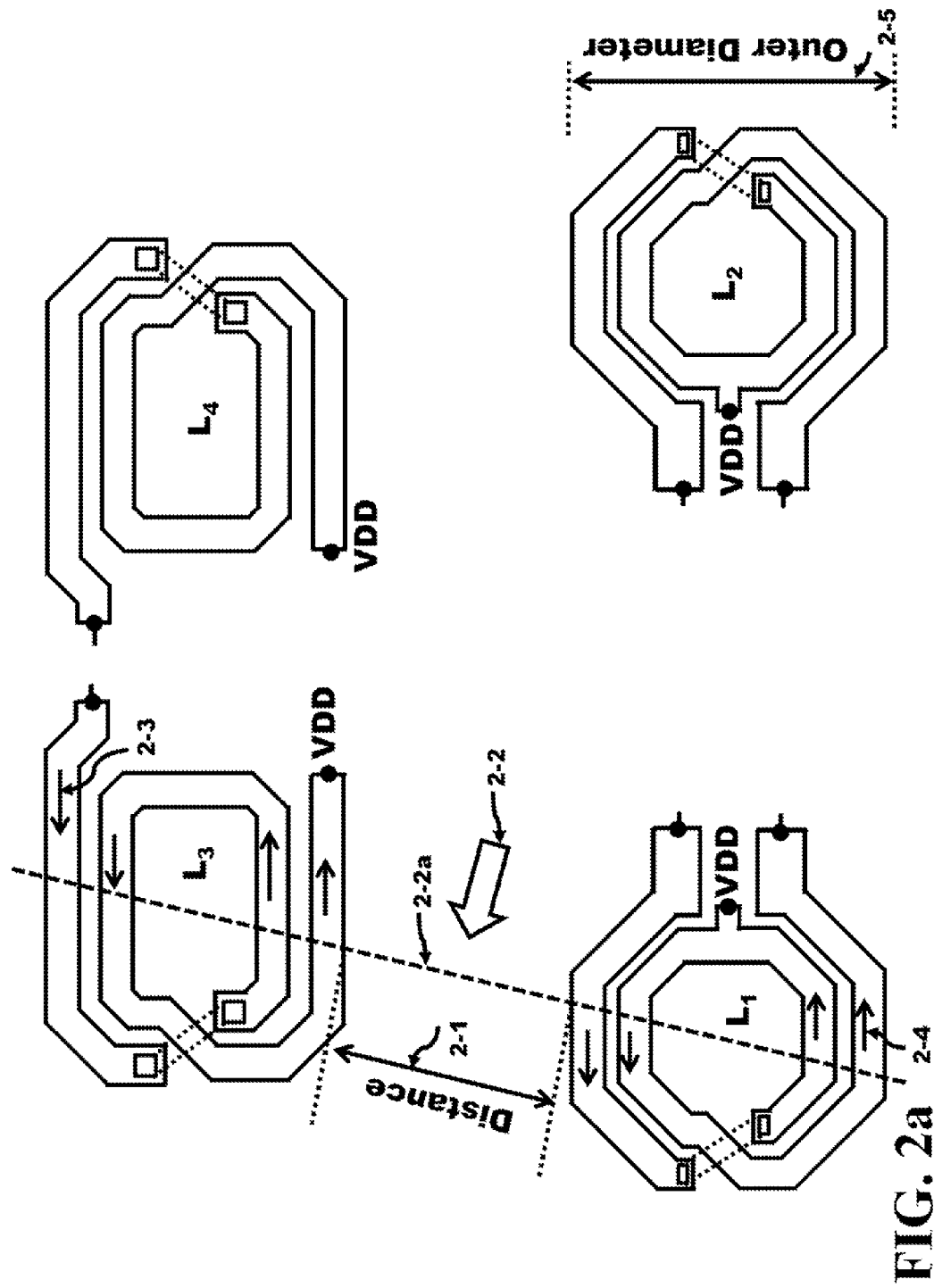
FIG. 2a illustrates a cross-sectional cut through the substrate between two inductors in accordance with the present invention.

In FIG. 2a, only the four inductors $L_1$, $L_2$, $L_3$ and $L_4$ are illustrated from FIG. 1a showing that the inductor $L_1$ has a distance 2-1 of separation from inductor $L_3$. The outer diameter 2-5 of inductor $L_2$ is also illustrated. Note that the current in inductor $L_3$ flows counterclockwise as indicated by the arrow 2-3. Similarly, the current flow in inductor $L_1$ also flows counterclockwise as indicated by the arrow 2-4. A dashed line 2-2a will provide a cross sectional perspective of the die as indicated by the arrow 2-2 of the magnetic coupling linking inductors $L_1$ and $L_3$. This cross-section of the silicon die will be depicted in FIG. 3a.

Figure 2B:
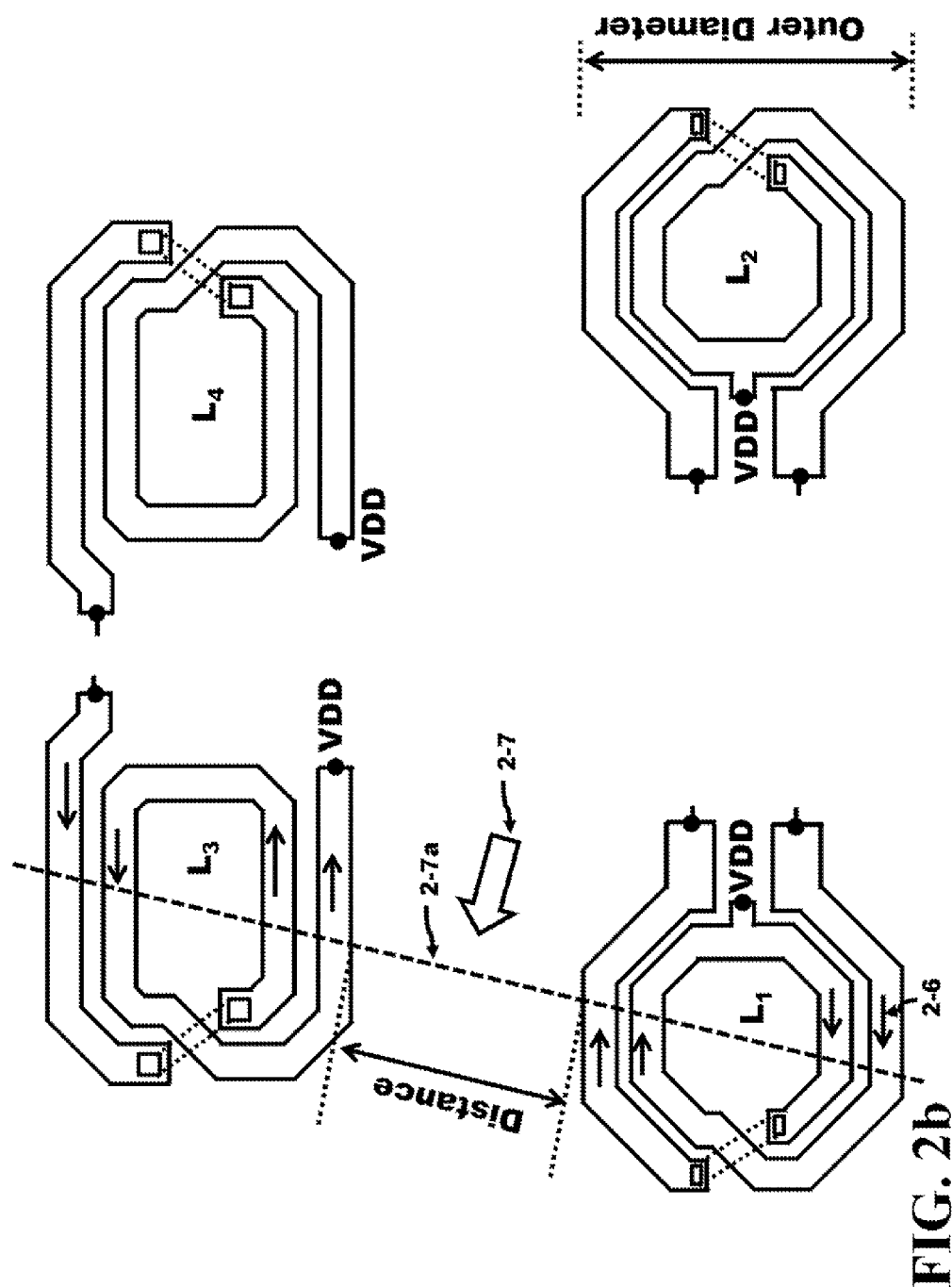
FIG. 2b depicts a cross-sectional cut through the substrate between two inductors with current reversed in one of the inductors in accordance with the present invention.

FIG. 2b also presents the same four inductors $L_1$, $L_2$, $L_3$ and $L_4$. The dashed line 2-7a will present the view indicated by the arrow 2-7. The cross-sectional view of the die will be presented in FIG. 3b. Note here that the current in $L_3$ is still flowing counterclockwise while now the current in inductor $L_1$ flows clockwise as indicated by the current flow 2-6 in the lower leg of inductor $L_1$.

Figure 2C:
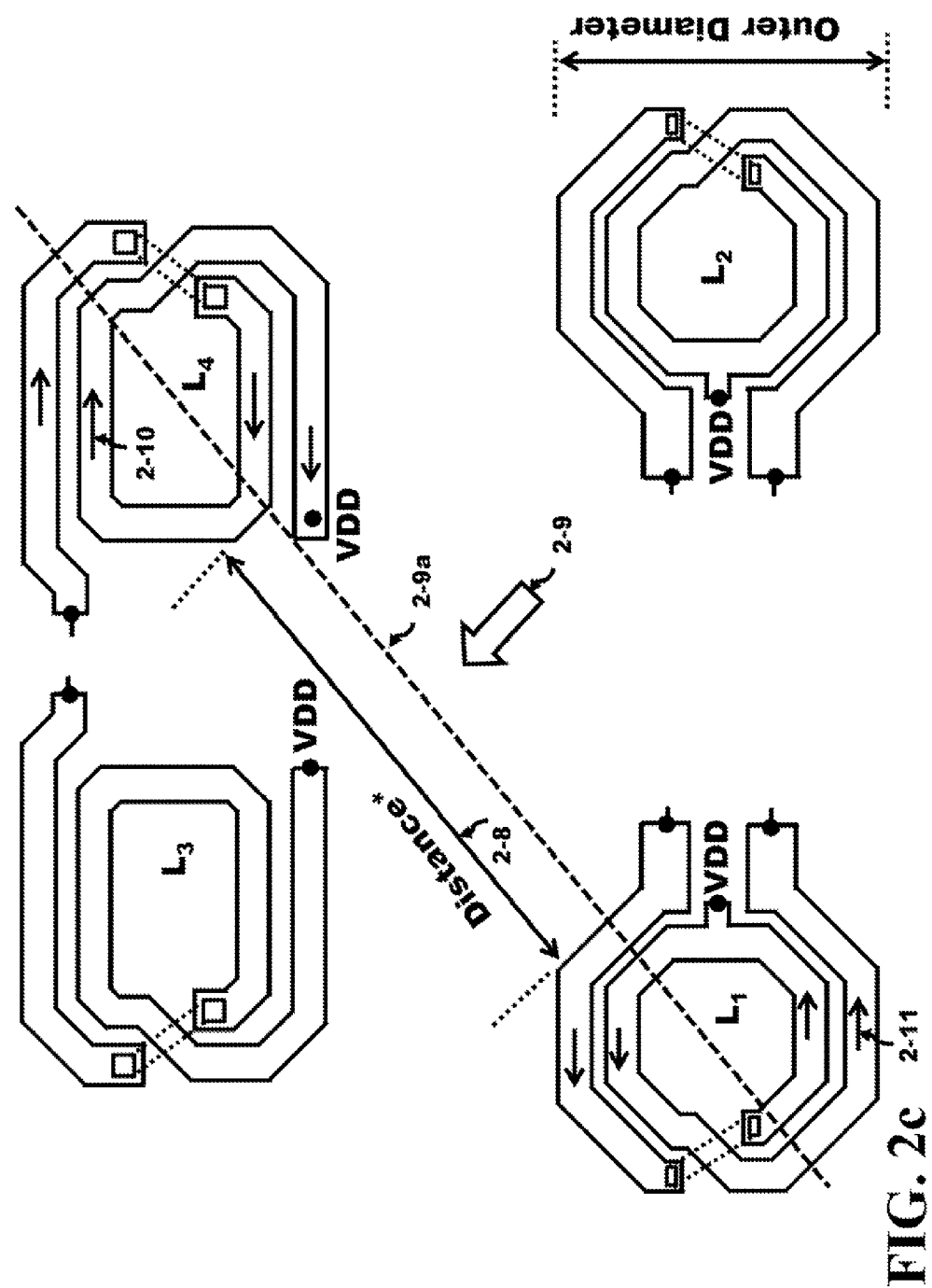
FIG. 2c shows a cross-sectional cut through the substrate between two diagonally displaced inductors in accordance with the present invention.

In FIG. 2c, a different cross-section representation will be illustrated. This time the dashed line 2-9a will present the cross-sectional view of inductors $L_1$ and $L_4$. The current flow in $L_4$ is indicated by the arrow 2-10 and is clockwise. The current flow in inductor $L_1$ is counterclockwise as indicated by the arrow 2-11. Note that the distance* 2-8 is larger than the distance 2-1 between inductors $L_1$ and $L_3$. The influence of the magnetic flux coupling between $L_1$ and $L_4$ should be reduced when compared to the magnetic flux coupling between $L_1$ and $L_3$. The cross-sectional view that will be presented is illustrated by the arrow 2-9 in FIG. 3c.

Figure 2D:
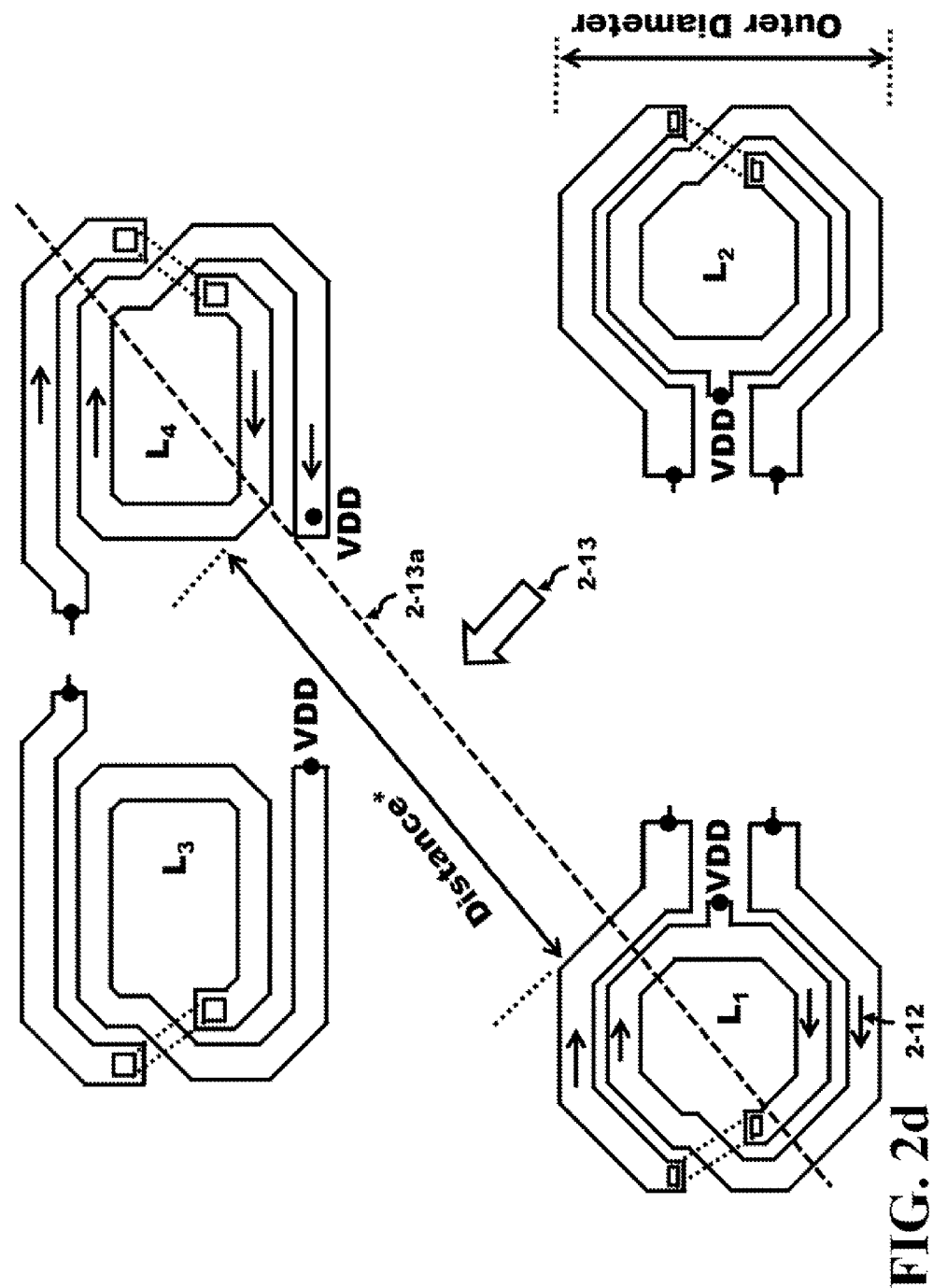
FIG. 2d presents a cross-sectional cut through the substrate between two diagonally displaced inductors with current reversed in one of the inductors in accordance with the present invention.

FIG. 2d illustrates that the current flow in inductor $L_4$ remains the same being clockwise, while the current flow in inductor $L_1$ is now clockwise as indicated by the arrow 2-12. The dashed line 2-13a will present the cross-sectional view of the die as indicated by the arrow 2-13 to be depicted in FIG. 3d.

FIG. 3a illustrates the view corresponding to the arrow 2-2 where the die is cut along the dashed line 2-2a. The cross-sectional view of the silicon die is illustrated and is not necessarily presented to scale. Assuming that the substrate is a p$^+$ starting substrate 3-1, a p-epi layer 3-2 is deposited on the substrate layer 3-1. Within this layer, an n-tub 3-3 (a p-tub could also be used) is formed by diffusion then through further deposition and processing, oxide layers are grown or deposited as illustrated by the oxide layer on top. Within the oxide layer exists the poly-silicon gates of the transistors, as well as, the eight metal layers for this particular process. However, only the top metal layer is typically used to form the inductors (other than the cross-under). The topmost layer (layer 8) is the thickest (about a micron thick) and is usually formed using copper (Cu). Because of these features, this layer is usually used to construct inductors since the thicker layer provides for a lower resistive loss. The squares containing the bulls-eye and cross-hair are fabricated using the metal 8 layer. The bulls-eye indicates that the current is flowing out of the page while the cross hair indicates that the current is flowing into the page. The cross-sectional view of inductor $L_1$ of FIG. 2a is indicated by the four metal squares 3-4, 3-4a, 3-4b and 3-4c while the cross-sectional view of inductor $L_3$ of FIG. 2a is indicated by the four metal squares 3-5, 3-5a, 3-5b and 3-5c. Due to the right-hand rule and the direction of current in $L_1$, the magnetic flux in the center of $L_1$ is in the direction away from the substrate. Note that the flux surrounding squares 3-4 and 3-4a is counter clockwise as indicated by the flux lines 3-6 and 3-7 while the flux surrounding squares 3-4b and 3-4c is clockwise as indicated by the flux lines 3-8 and 3-9. The square including 3-5, 3-5a, 3-5b and 3-5c shows the current flow in inductor $L_3$. Due to the direction of current in $L_3$, the magnetic flux in the center of $L_3$ is also in the direction away from the substrate. Note that the flux surrounding squares 3-5 and 3-5a is counter clockwise as indicated by the flux line 3-10 while the flux surrounding squares 3-5b and 3-5c is clockwise. Due the short distance 2-1 separating the inductors $L_1$ from $L_3$, the flux in inductor $L_1$ influences the current flow in inductor $L_3$. This is a magnetic coupling between inductors $L_1$ and $L_3$. It is this interaction which the inventive embodiment tries to compensate with a new cancellation technique.

FIG. 3b illustrates the view corresponding to the arrow 2-7 where the die is cut along the dashed line 2-7a. The cross-sectional view of inductor $L_1$ of FIG. 2b is indicated by the four metal squares 3-4, 3-4a, 3-4b and 3-4c while the cross-sectional view of inductor $L_3$ of FIG. 2b is indicated by the four metal squares 3-5, 3-5a, 3-5b and 3-5c. Due to the right-hand rule and the direction of current in $L_1$, the magnetic flux in the center of $L_1$ is in the direction towards the substrate. Note that the flux surrounding squares 3-4 and 3-4a is clockwise as indicated by the flux lines 3-6a and 3-7a while the flux surrounding squares 3-4b and 3-4c is counter clockwise as indicated by the flux lines 3-8a and 3-9a. The square including 3-5, 3-5a, 3-5b and 3-5c shows the current flow in inductor $L_3$. Due to the direction of current in $L_3$, the magnetic flux in the center of $L_3$ is still in the direction away from the substrate. Note that the flux surrounding squares 3-5 and 3-5a is counter clockwise as indicated by the flux line 3-10 while the flux surrounding squares 3-5b and 3-5c is clockwise. Due the short distance 2-1 separating the inductors $L_1$ from $L_3$, the coupling in inductor $L_1$ influences the current flow in inductor $L_3$. This magnetic coupling between inductors $L_1$ and $L_3$ now has an opposite effect than in FIG. 3a. Now the interacting coupling between $L_1$ and $L_3$ aid each other as indicated by 3-13 and 3-10.

Figure 3C:
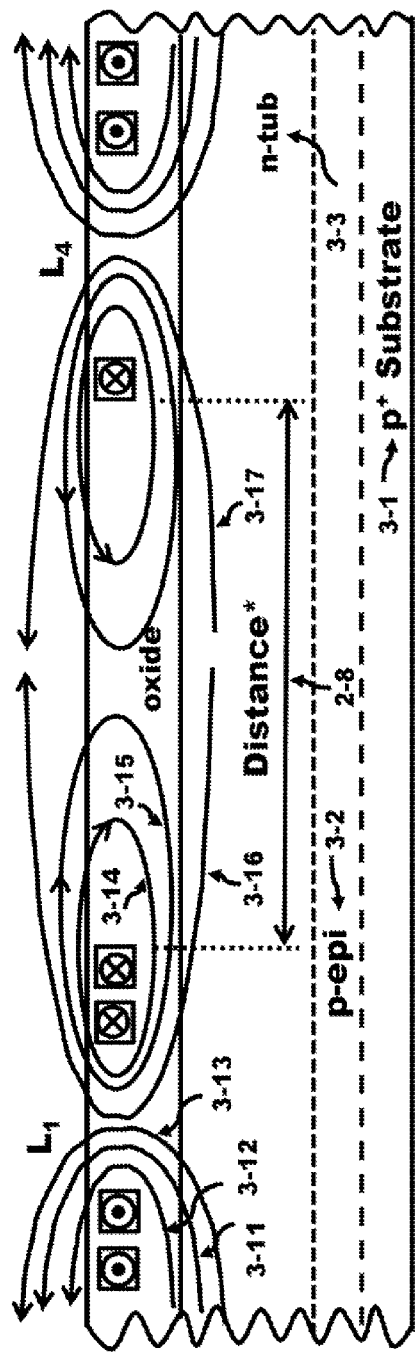
FIG. 3c presents the cross-sectional view of FIG. 2c in accordance with the present invention.

FIG. 3c illustrates the view corresponding to the arrow 2-9 where the die is cut along the dashed line 2-9a as illustrated in FIG. 2c. The cross-sectional view of inductor $L_1$ of FIG. 2c is indicated by the associated four metal squares to the left while the cross-sectional view of inductor $L_4$ of FIG. 2c is indicated by the three metal squares to the right. Due to the right-hand rule and the direction of current in $L_1$, the magnetic flux in the center of $L_1$ is in the direction away from the substrate. Note that the flux surrounding squares on the left side of the center of $L_1$ is counter clockwise as indicated by the flux lines 3-11, 3-12 and 3-13 while the flux surrounding squares on the right hand side of the center of $L_1$ 3-14, 3-15 and 3-16 is clockwise. Due to the direction of current in $L_4$, the magnetic flux in the center of $L_4$ is in the direction away from the substrate. Note that the flux surrounding the single square is counter clockwise as indicated by the flux line 3-17 while the flux surrounding the remaining squares proceeds clockwise. Due the larger distance* 2-8 separating the inductors $L_1$ from $L_4$ as compared to the distance 2-1, the magnetic coupling between $L_1$ and $L_4$ has a reduced impact on the induced current flow in inductor $L_4$.

Figure 3D:
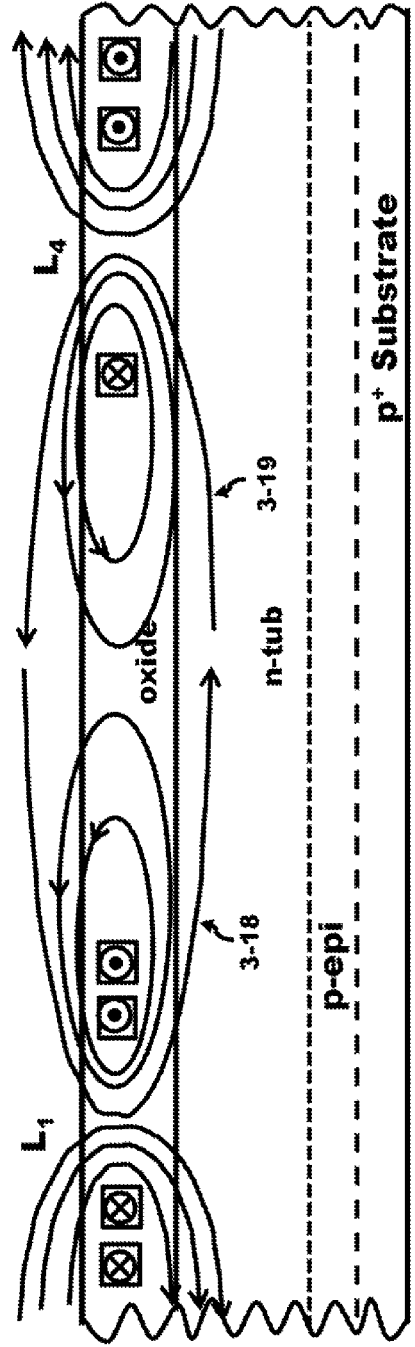
FIG. 3d illustrates the cross-sectional view of FIG. 2d in accordance with the present invention.

FIG. 3d illustrates the view corresponding to the arrow 2-13 where the die is cut along the dashed line 2-13a as illustrated in FIG. 2d. The cross-sectional view of inductor $L_1$ of FIG. 2d is indicated by the associated four metal squares to the left while the cross-sectional view of inductor $L_4$ of FIG. 2c is indicated by the three metal squares to the right. Due to the right-hand rule and the direction of current in $L_1$, the magnetic flux in the center of $L_1$ is in the direction towards the substrate. Note that the flux surrounding squares on the left side of the center of $L_1$ is clockwise as indicated by the corresponding flux lines while the flux surrounding the squares on the right hand side of the center of L1 is counter clockwise as indicated by 3-18. Due to the direction of current in $L_4$, the magnetic flux in the center of $L_4$ remains the same and is in the direction away from the substrate. Note that the flux surrounding the single square is counter clockwise as indicated by the flux line 3-19 while the flux surrounding the remaining squares proceeds clockwise. Due the larger distance* 2-8 separating the inductors $L_1$ from $L_4$ as compared to the distance 2-1, the magnetic coupling between $L_1$ and $L_4$ has a reduced impact on the induced current flow in inductor $L_4$.

Figure 4A:
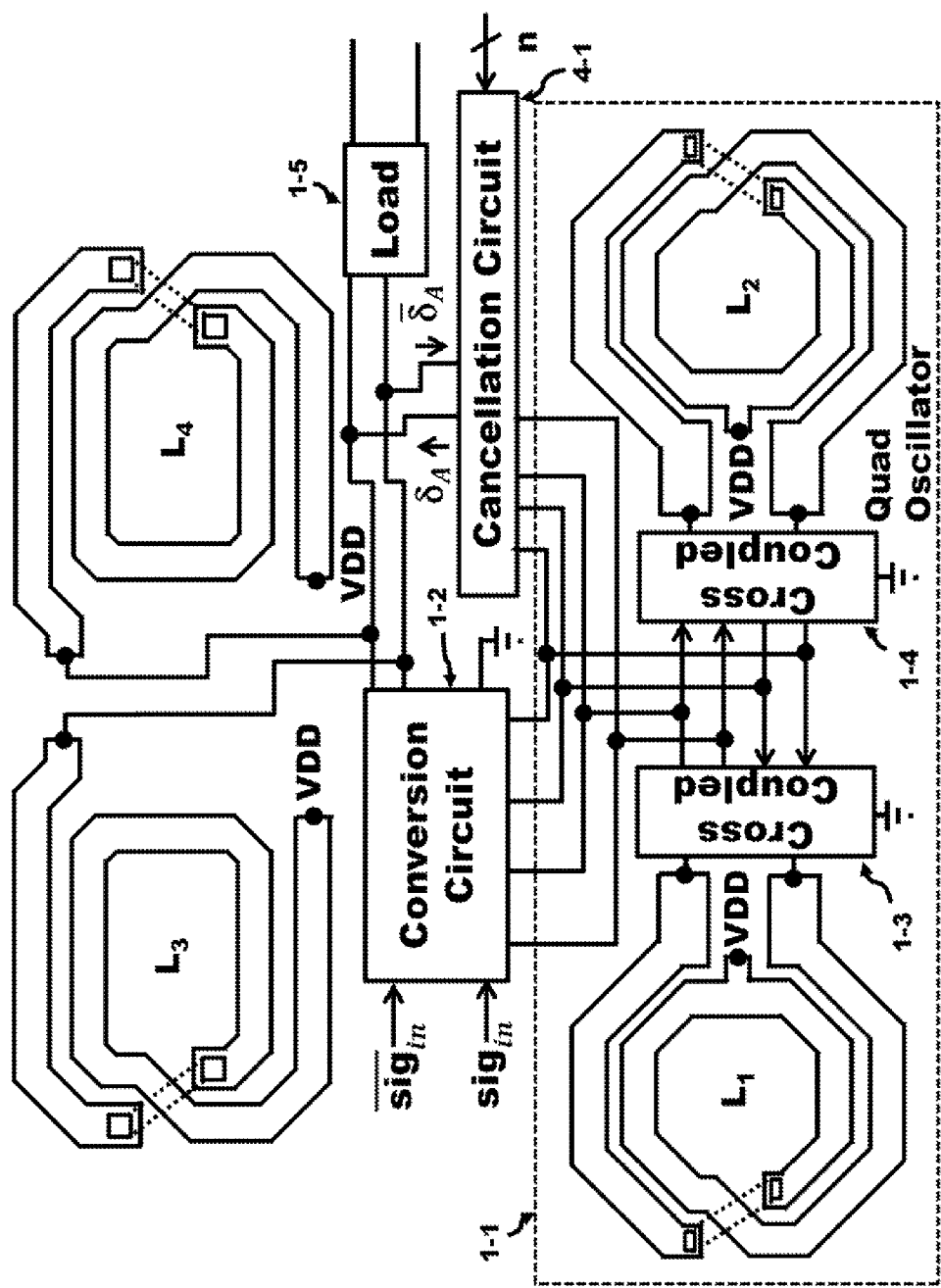
FIG. 4a illustrates depicts a block diagram of the quadrature oscillator, conversion circuit, load and inductor placement along with the cancellation circuit in accordance with the present invention.

Because of the distance* 2-8 illustrated in FIG. 2c and FIG. 2d is greater than the distance 2-1 illustrated in FIG. 2a and FIG. 2b, the magnetic coupling interaction between $L_1$ and $L_4$ versus $L_1$ and $L_3$ will be considered a second order effect. The inventive embodiment will address the magnetic coupling interaction of the shorter distance 2-1. Thus, the interaction between inductors $L_1$ and $L_3$ and inductors $L_2$ and $L_4$ will be substantially compensated by the current output of the cancellation circuit 4-1 illustrated in FIG. 4a.

The cancellation circuit has digital and analog inputs which are used to control the current sources and to enable or disable the cancellation circuit. The cancellation circuit provides a current $\delta_a$ and a negative current equal in magnitude to $\delta_a$. These currents are used to compensate for the magnetic coupling that is being linked into the two inductors $L_3$ and $L_4$ by inductors $L_1$ and $L_2$, respectively. By adjusting the analog current in the cancellation circuit, the magnetic coupling interaction between $L_1$ and $L_3$ as well as $L_2$ and $L_4$ can be compensated and allow this circuit to behave as if these two sets of inductors were distantly removed from one another.

Figure 4B:
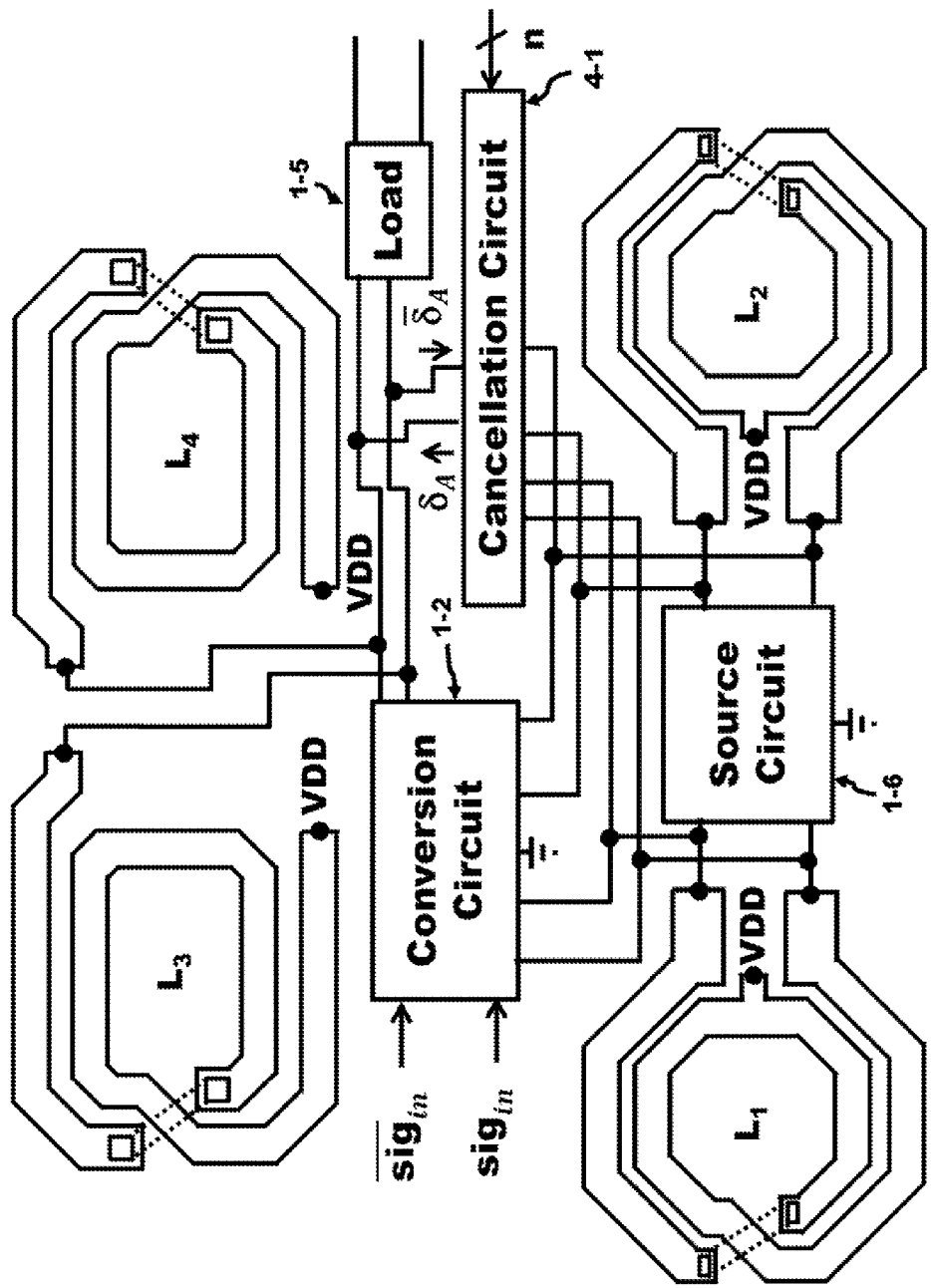
FIG. 4b depicts a block diagram of the source circuit, conversion circuit, load and inductor placement along with the cancellation circuit in accordance with the present invention.

FIG. 4b illustrates the circuit of FIG. 1b with the inventive embodiment of the cancellation circuit 4-1. The magnetic coupling between $L_1$ and $L_3$ as well as the magnetic coupling between $L_2$ and $L_4$ is compensated by the cancellation circuits 4-1 that introduces a current $\delta_a$ and a negative current equal in magnitude to $\delta_a$ into the inductors $L_4$ and $L_3$.

Figure 4C:
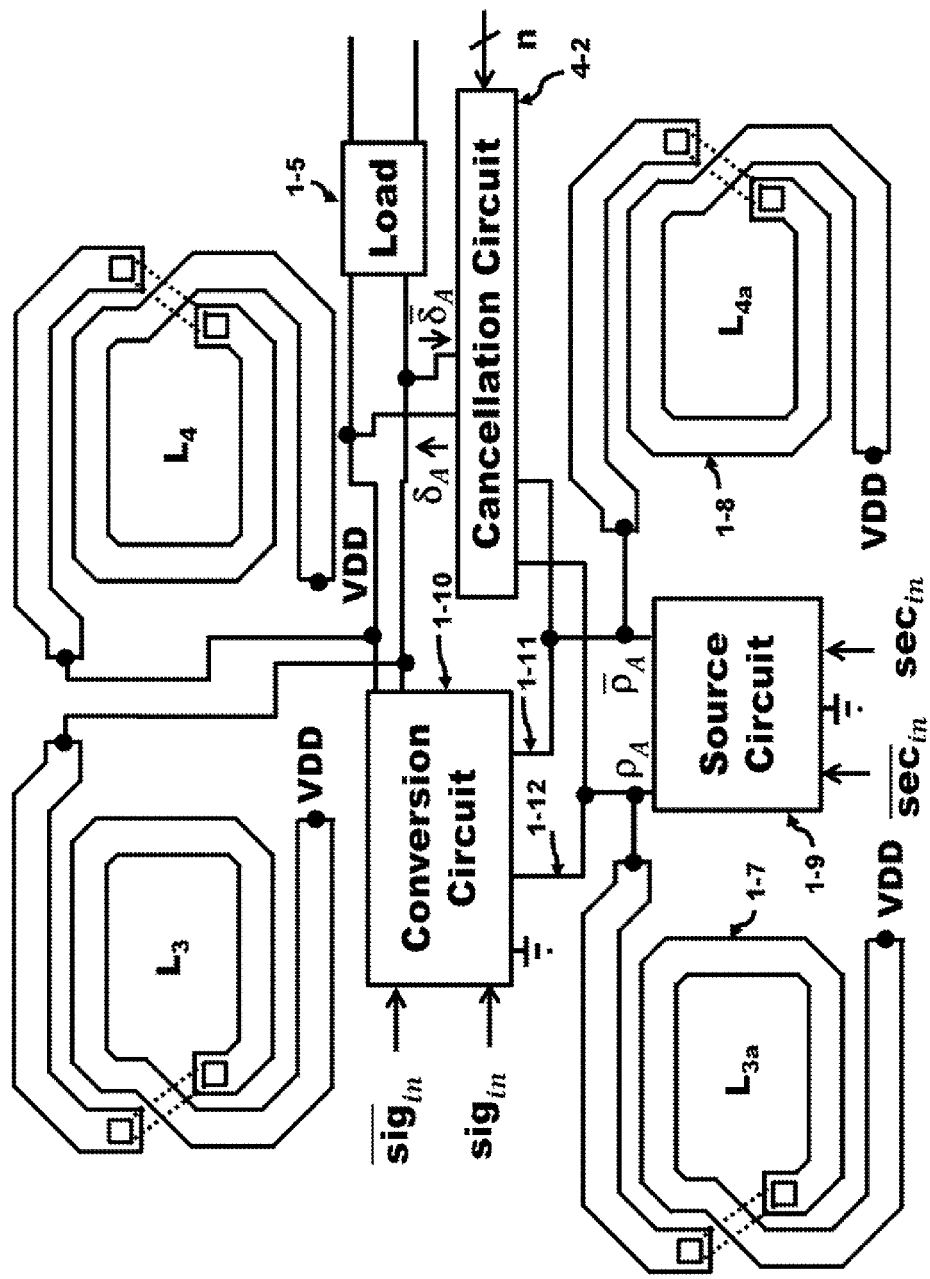
FIG. 4c presents a block diagram of the source circuit with two outputs, conversion circuit, load and inductor placement along with the cancellation circuit in accordance with the present invention.

FIG. 4c depicts the circuit of FIG. 1c with the inventive embodiment where the source circuit 1-9 generates two outputs $\rho_A$ 1-12 and its compliment 1-11. In addition the center tapped inductors $L_1$ and $L_2$ of FIG. 1a are replaced by inductors $L_{3a}$ and $L_{4a}$. The source circuit 1-9 receives a second differential input signal; $sec_{in}$ and its compliment from a previous circuit. The cancellation circuit 4-2 receives only the two signals $\rho_A$ 1-12 and its compliment 1-11 and generates the current $\delta_a$ and a negative current equal in magnitude to $\delta_a$ to compensate for the magnetic coupling between $L_{3a}$ and $L_3$, as well as, the magnetic coupling between $L_{4a}$ and $L_4$.

Figure 5:
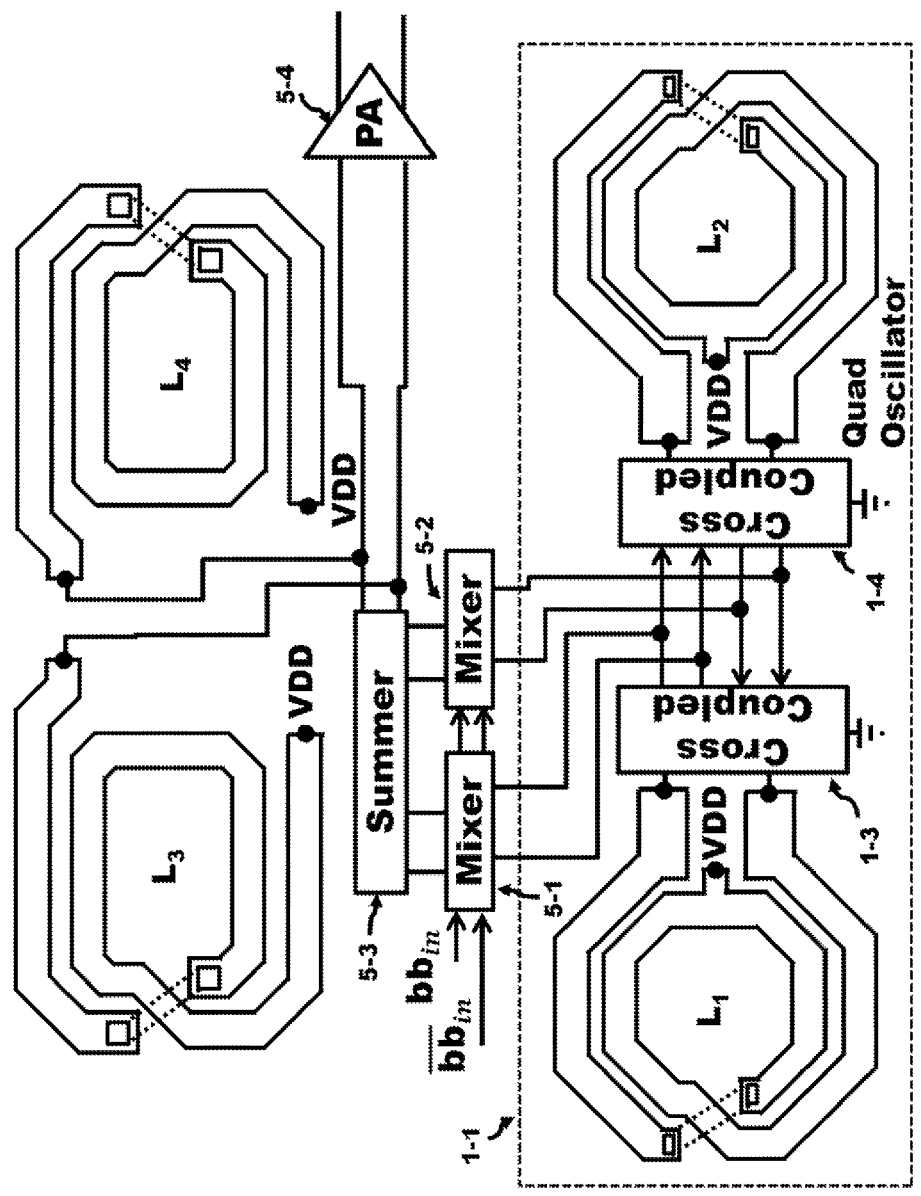
FIG. 5 shows the conversion circuit and load block of FIG. 1 replaced by mixers, summer and a power amplifier block in accordance with the present invention.

The block diagram of FIG. 1a presenting the conversion circuit 1-2 and the load 1-5 are substituted with circuit components of the transceiver as illustrated in FIG. 5. The conversion circuit 1-2 is substituted with two baseband mixers; one operating on the I signal and the second operating on the Q signal. Both mixers are fed the I and Q differential baseband signal $bb_{in}$. The output of the mixers is current driven and therefore can be connected together combining the current together which effectively sums the currents together as indicated by the summer 5-3. The summer 5-3 and the two mixers 5-1 and 5-2 received their power supply through inductors $L_3$ and $L_4$ thereby providing a differential output to the power amplifier 5-4 which represents the load 1-5. In this circuit, the magnetic coupling interaction described earlier between $L_1$ and $L_3$ as well as $L_2$ and $L_4$ causes a non-symmetrical behavior to occur over a range of frequencies as will be shown shortly.

Figure 6:
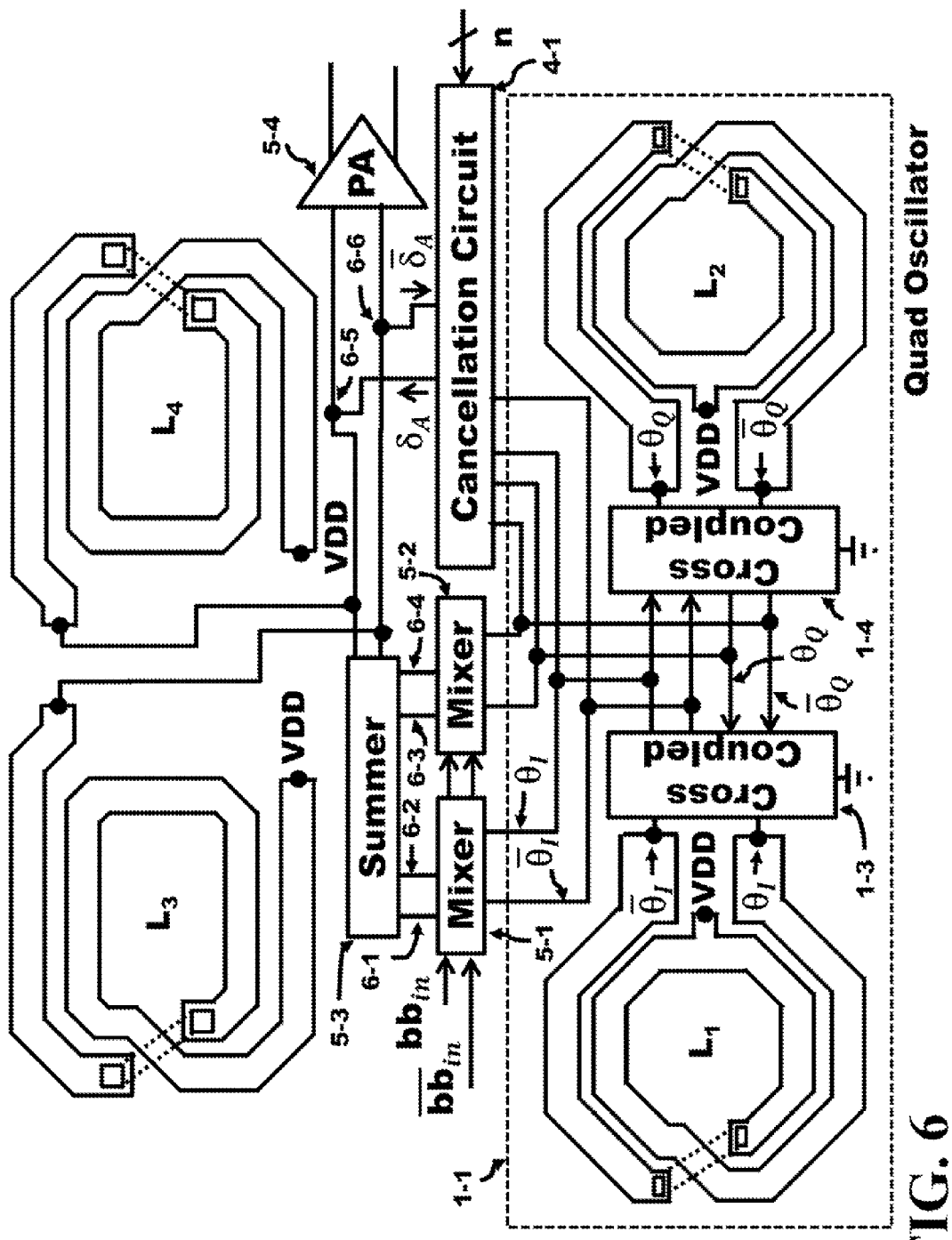
FIG. 6 depicts FIG. 5 with the addition of the cancellation circuit in accordance with the present invention.

The inventive circuit is illustrates in FIG. 6. By incorporating the cancellation circuit 4-1 into the diagram of FIG. 5, as illustrated in FIG. 6, the coupling interaction between inductors $L_1$ and $L_3$, as well as, inductors $L_2$ and $L_4$ can be compensated and corrected over a range of frequencies as will be shown shortly. The cancellation circuit 4-1 takes several inputs (n): two independent currents to adjust two current sources independently and a digital disable signal to disable the cancellation circuit 4-1.

Figure 7B:
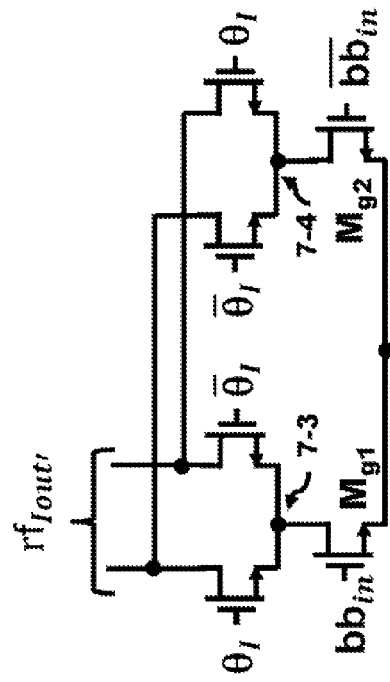
FIG. 7b illustrates depicts a transistor mixer circuit in accordance with the present invention.
Figure 7C:
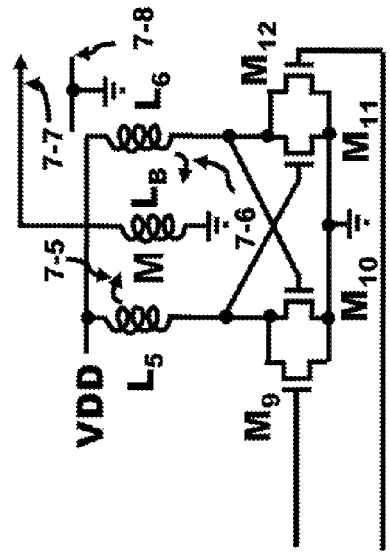
FIG. 7c shows the transistor, inductor and mutual coupling of a power amplifier circuit in accordance with the present invention.
Figure 7A:
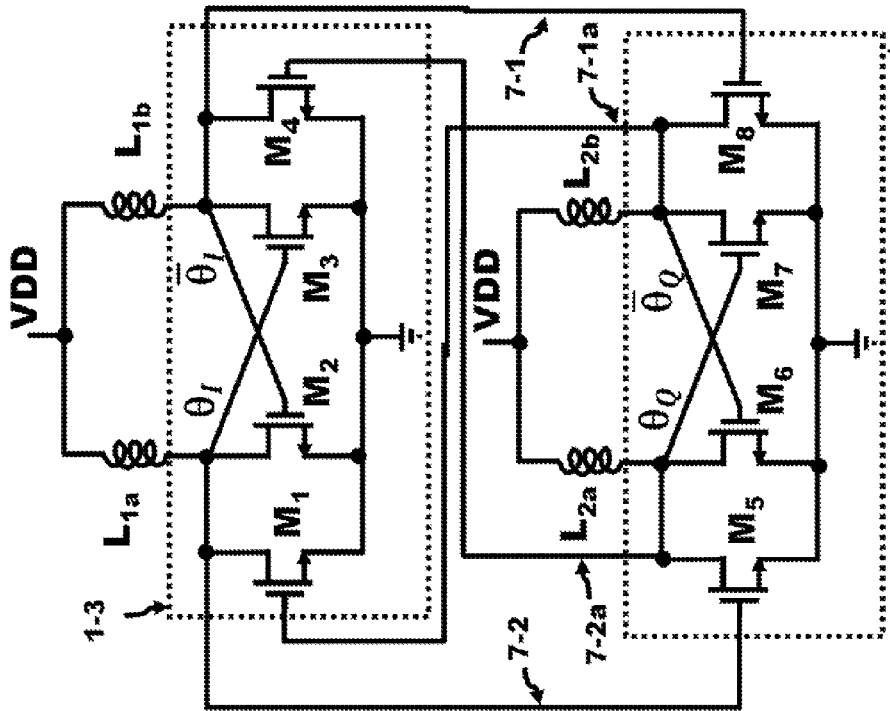
FIG. 7a depicts the cross coupled transistor circuit and inductors of the quadrature oscillator in accordance with the present invention.

The cross coupled blocks 1-3 and 1-4 along with the inductive load of center tapped $L_1$ and $L_3$ is illustrated by the schematic diagram presented in FIG. 7a. The dotted block 1-3 represents the cross coupled block which contains the cross coupled devices $M_2$ and $M_3$ that is coupled to VDD by the inductors $L_{1a}$ and $L_{1b}$. Similarly, the dotted block 1-4 represents the cross coupled block containing the cross coupled devices $M_6$ and $M_7$ that is coupled to VDD by the inductors $L_{2a}$ and $L_{2b}$. To generate the quadrature signal, devices $M_1$, $M_4$, $M_5$ and $M_8$ transfer the signals between the two cross coupled oscillating circuits. For example, the output drain of $M_2$ is coupled to the gate of $M_5$ via 7-2 while the drain of $M_3$ is coupled to the gate of the device $M_8$ by the connection 7-1. Similarly, the drain of device $M_6$ is coupled to the gate of device $M_4$ by interconnect 7-2a while the drain of device $M_7$ is coupled to the gate of device $M_1$ by the interconnect 7-1a. The device $M_1$ is in parallel with device $M_2$, the device $M_4$ is in parallel with device $M_3$, the device $M_5$ is in parallel with device $M_6$ and the device $M_8$ is in parallel with device $M_7$. Because of this circuit configuration, the circuit generates a quadrature output as labeled by $\Theta_I$ and its differential signal and $\Theta_Q$ and its differential signal.

An example of a mixer is illustrated in FIG. 7b. The baseband signals are provided to the gates of $M_{g1}$ and $M_{g2}$. The drain 7-3 of $M_{g1}$ and the drain 7-4 of $M_{g2}$ are coupled to the differential gates controlled by the output clock I signal ($\Theta_I$) and its complement to generate the RF output of the I signal. The other mixer is identically the same except the second mixer uses the Q output of the clock signal ($\Theta_Q$) and generates the RF output of the Q signal.

The power amplifier is illustrated in FIG. 7c. The differential input is applied to the gates of $M_9$ and $M_{12}$ which are in parallel with the cross coupled devices $M_{10}$ and $M_{11}$. The load for $M_{10}$ and $M_{11}$ are the inductors $L_5$ and $L_6$ that are coupled to VDD. Another inductor $L_B$ is mutually coupled to inductors $L_5$ via 7-5 and $L_6$ via 7-6 to provide an output signal at 7-7 and 7-8. This transmitter can operate at 60 Ghz. For an example of a reducing the resistance in the Power Amplifier, U.S. patent application Ser. No. 13/243,986, "Method and Apparatus of Minimizing Extrinsic Parasitic Resistance in 60 GHz Power Amplifier Circuits," filed on Sep. 23, 2011 and commonly assigned herewith, disclose certain subject matter which is common hereto and describes a power amplifier, suitable for amplifying and driving an antenna and is incorporated herein by reference.

Figure 7D:
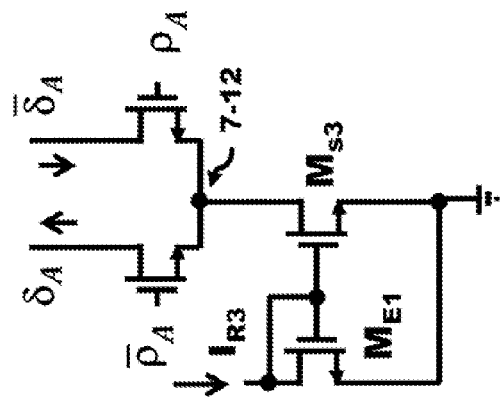
FIG. 7d depicts the transistor connectivity for the cancellation circuit in accordance with the present invention.

The cancellation circuit is illustrated in FIG. 7d. The reference currents $I_{R1}$ and $I_{R2}$ are applied to the current sources comprised of $M_{c1}$ and $M_{s1}$ as well as $M_{c2}$ and $M_{s2}$. These two currents $I_{R1}$ and $I_{R2}$ are adjustable/programmable. The adjustment can be controlled by analog, digital or a combination of both methods to adjust these two currents. Furthermore, the adjustment the current $I_{R1}$ can be performed independently of the current $I_{R2}$. This allows the cancellation output currents $\delta_a$ to be adjusted to account for both the I and Q signals, simultaneously.

Figure 7E:
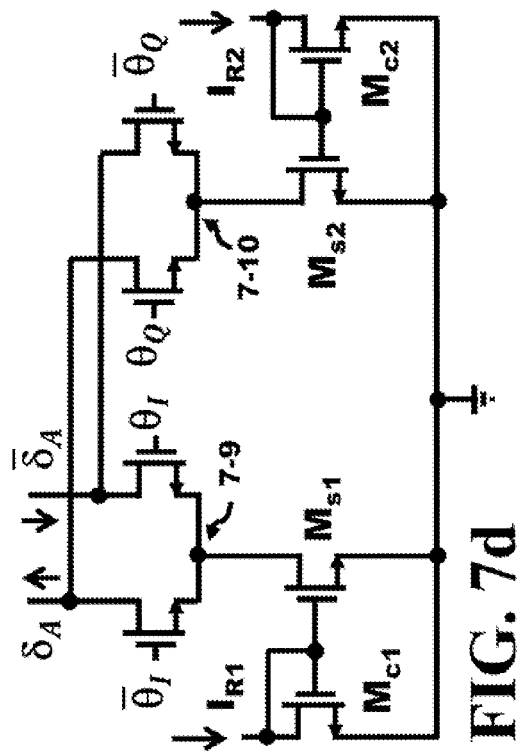
FIG. 7e depicts the transistor connectivity for the cancellation circuit including the disable circuit to reduce the power dissipation in accordance with the present invention.

The drain 7-9 of $M_{s1}$ is coupled to the differential circuit controlled by the I clock signal and its complement. The drain 7-10 of $M_{s2}$ is coupled to the differential circuit controlled by the Q clock signal and its complement. The two differential signals are combined as illustrated to generate a current $\delta_a$ and a negative current equal in magnitude to $\delta_a$. The current from these two outputs compensate for the induced magnetic coupling of the inductors $L_1$ and $L_2$ into the inductors $L_3$ and $L_4$, respectively. FIG. 7e illustrates the same circuit with the disable signal 7-11 and devices $M_{D1}$ and $M_{D2}$. When signal 7-11 is digitally high, the compensating circuit is disabled.

Figure 7F:
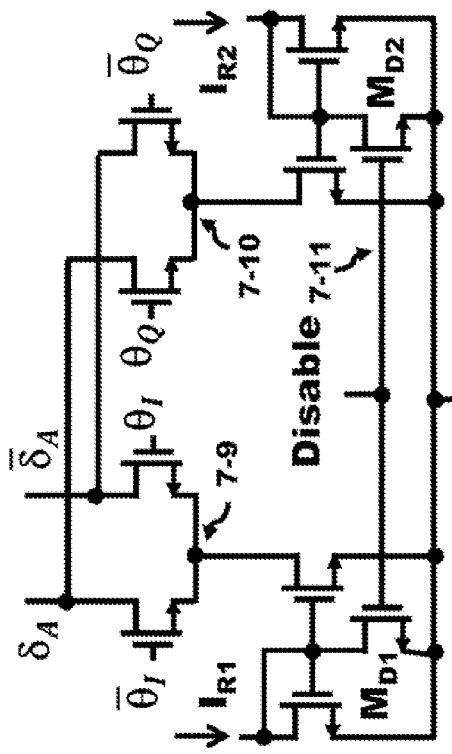
FIG. 7f illustrates the transistor connectivity for the cancellation circuit with two inputs in accordance with the present invention.

FIG. 7f depicts the cancellation circuit 4-2 of FIG. 4cA reference current $I_{R3}$ is provided to the current source composed of $M_{E1}$ and $M_{g3}$. The drain 7-12 of $M_{g3}$ is coupled to the differential circuit controlled by two signals $\rho_A$ and its compliment signal which are generated by the source circuit 1-9 and the inductors $L_{3a}$ and $L_{4a}$ which are coupled to the power supply as illustrated in FIG. 4c. The output current $\delta_a$ and a negative current equal in magnitude to $\delta_a$ are provided to the inductors $\delta_a$ and $L_4$ being magnetically coupled to the inductors $L_{3a}$ and $L_{4a}$ that are coupled to the source circuit 1-9. The output current $\delta_a$ and a negative current equal in magnitude to $\delta_a$ is introduced into inductors $L_3$ and $L_4$ to compensate for the magnetic coupling between $L_{3a}$ and $L_3$ as well as the magnetic coupling between $L_{4a}$ and $L_4$.

In FIG. 6 the clock signals $\theta_I$ and $\overline{\theta}_I$ couple the output signals of cross-coupled block 1-3 to cross-coupled block 1-4 and clock signals $\theta_Q$ and $\overline{\theta}_Q$ couple the output signals of cross-coupled block 1-4 to cross-coupled block 1-3. This naming convention of the dock signals follows the same naming convention as provided and illustrated in FIG. 1a. Mixer 5-1 receives the clock signals $\theta_I$ and $\overline{\theta}_I$ to generate the output signals 6-1 and 6-2 coupled to the summer 5-3, while mixer 5-2 receives the clock siunals $\theta_Q$ and $\overline{\theta}_Q$ to also generate the output signals 6-3 and 6-4 coupled to the summer 5-3. The output of the mixers being current driven can therefore be connected together combining the current together which effectively sums the currents together as indicated by the summer 5-3. Thus, summer 5-3 sums or combines the currents 6-1 of mixer 5-1 and 6-3 of mixer 5-2 to provide the combined current at node 6-5. Similarly, summer 5-3 sums or combines the currents 6-2 of mixer 5-1 and 6-4 of mixer 5-2 to provide the combined current at node 6-6. The cross-coupled block 1-3 is con led to inductor $L_1$ by clock signals $\theta_I$ and $\overline{\theta}_I$ while the cross-coupled block 1-4 is coupled to inductor $L_2$ by clock signals $\theta_Q$ and $\overline{\theta}_Q$. The summer 5-3 connects output signals 6-1 and 6-3 to node 6-5 makinu these nodes equivalent and, in addition, connects output signals 6-2 and 6-4 to node 6-6 making these nodes equivalent as well.

Figure 7G:
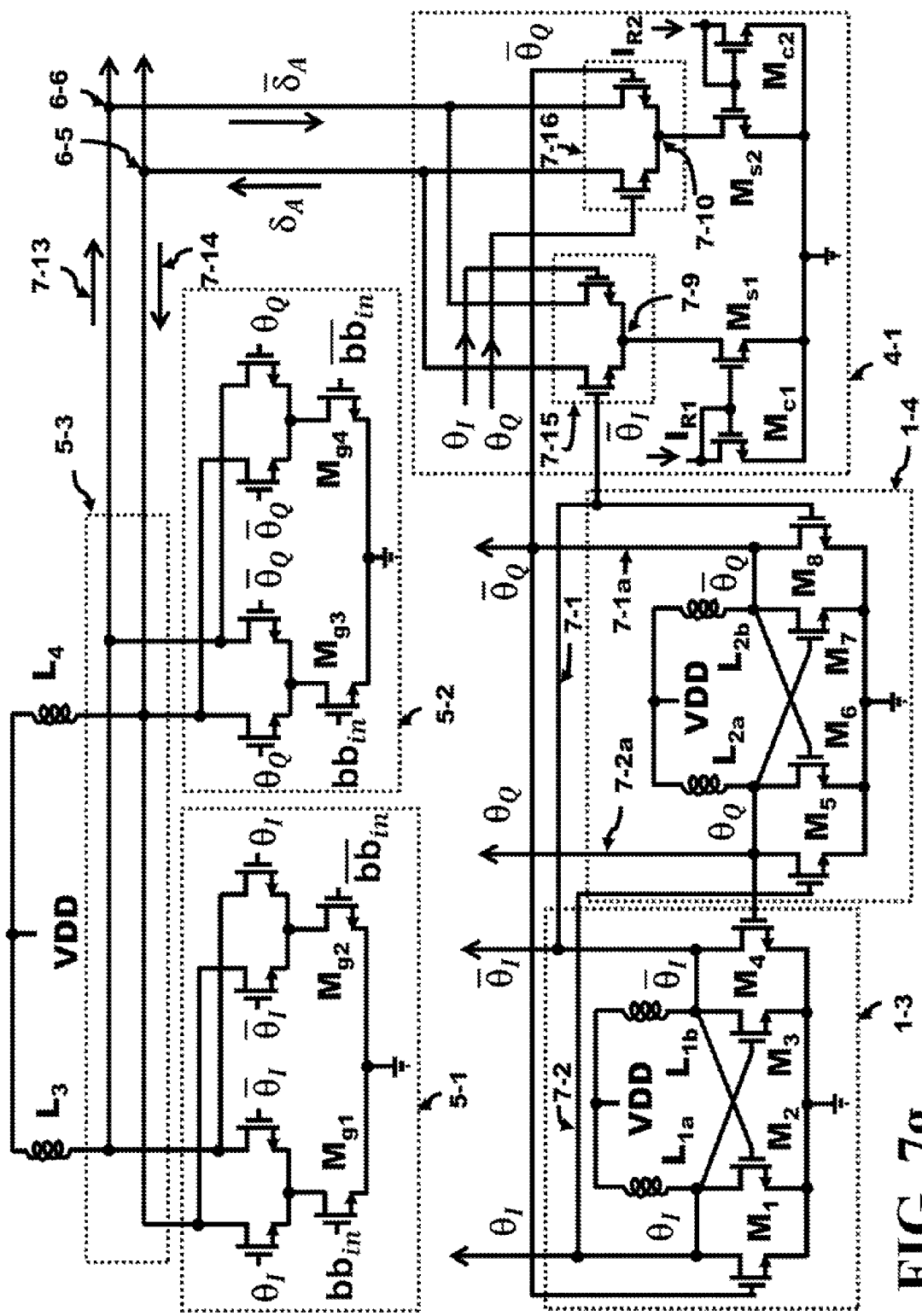
FIG. 7g depicts the transistor connectivity within the various blocks in the block diagram of FIG. 6 in accordance with the present invention.

FIG. 7g presents the transistor connectivity within the corresponding blocks of FIG. 6 and provides a description of how the cancellation circuit 4-1 operates. The first cross-coupled block 1-3 and the second cross-coupled block 1-4 generate the output clock I signal($\Theta_I$) and output clock Q signal ($\Theta_Q$) and their correspnding compliments signals, respectively. These cross-coupled circuits are coupled together via interconnects 7-1, 7-2, 7-1a and 7-2a to form a quadrature oscillator. The outputs of the quadrature oscillator generate and distribute the output clock I signal ($\Theta_Q$) and output clock Q signal ($\Theta_Q$) and their corresponding compliment signals to the mixers 5-1 and 5-2, and the cancellation circuit 4-1. The two cross coupled blocks 1-3 and 1-4 are each coupled to the center tapped inductor $L_1$ (formed $L_{1a}$ and $L_{1b}$) and inductor $L_2$ (formed by $L_{2a}$ and $L_{2b}$), respectively. These inductors are not included within the cross-coupled blocks 1-3 and 1-4 as illustrated in FIG. 6 but are shown inside the dotted blocks 1-3 and 1-4 of FIG. 7g to simplify the drawing. The output clock signals ($\Theta_I$) and ($\Theta_Q$) and their compliment signals are coupled to the two mixers 5-1 and 5-2, and the cancellation circuit 4-1.

The mixer 5-1 mixes the input signals $bb_{in}$ and its compliment with the applied I clock signals of cross coupled blocks 1-3 while the mixer 5-2 mixes the input signals $bb_{in}$ and its compliments with the applied Q clock signals of cross coupled blocks 1-4. A first output of the I mixer 5-1 is coupled to a first output of the Q mixer 5-2 and is labeled as the node 6-5, the second output of the I mixer 5-1 is coupled to the second output of the Q mixer 5-2 and is labeled as the node 6-6. The outputs of the I and Q mixers are current driven and therefore can be connected together combining the currents together which effectively sums the currents together as indicated by the connects within the summer 5-3 of FIG. 7g. The summer 5-3, and the two mixers 5-1 and 5-2 receive their power supply through inductors $L_3$ and $L_4$ thereby providing a pair of differential current outputs 7-13 and 7-14, one flowing to node 6-6 and the other flowing from node 6-6.

The cancellation circuit 4-1 has a similar circuit configuration as one of the mixers except that the two transistors $M_{s1}$ and $M_{s1}$ (instead of being driven by the input signals $bb_{in}$ and its compliment) are instead controlled by the diode connected current controlled devices $M_{c1}$ and $M_{c2}$. These two controlled currents $I_{R1}$ and $I_{R2}$ are adjustable or programmable. The adjustment can be controlled by analog, digital or to combination of both methods to adjust these two currents. Furthermore, the adjustment of the current $I_{R1}$ can be performed independently of the current $I_{R2}$. The currents $I_{R1}$ and $I_{R2}$ can be used to control the amount of current flowing through nodes 7-9 and 7-10 at the base of the pair of the differential transistor pairs 7-15 and 7-16. The cancellation circuit 4-1 is also different from one of the mixers in that the first differential transistor pair 7-15 is driven by the clock I signal ($\Theta_I$) and its compliment signal, while the second differential transistor pair 7-15 is driven by the clock I signal ($\Theta_Q$) and its compliment signal. The similarity to the mixers is that the first output of the first transistor pair 7-15 is coupled to a first output of the second transistor pair 7-16 and coupled to node 6-5, while the second output of the first transistor pair 7-15 is coupled to the second output of the second transistor pair 7-16 and coupled to node 6-6. The two air of differential current signals are combined as illustrated to generate a current $\delta_a$ and a negative current equal in magnitude to $\delta_a$.

The cancellation circuit 4-1 also receives the power supply through inductors $L_3$ and $L_4$ thereby providing a pair of differential current output $\delta_a$ and the compliment of $\delta_a$, one flowing to node 6-5 and the other flowing from node 6-6 This allows the cancellation out nit currents $\delta_a$ and the compliment of $\delta_a$ to he adjusted by the two currents and $I_{R1}$ and $I_{R2}$ to be added or subtracted from the currents 7-13 and 7-14. Note that both the I mixer 5-1 and the differential transistor 7-15 are both controlled by the clock I signal ($\Theta_I$) and its compliment signal while the Q mixer 5-2 and the differential transistor pair 7-16 are both controlled by the clock Q signal ($\Theta_Q$) and its compliment signal. The differential current contributions of mixers 5-1 and 5-2, and the differential transistor pairs 7-15 and 7-16 are combined at nodes 6-5 and 6-6, respectively. Thus, when the induced magnetic coupling of the inductors $L_1$ and $L_2$ occurs between the inductors and $L_3$ and $L_4$, the induced magnetic coupling introduces a coupling current component into the inductors $L_3$ and $L_4$, By adjusting te combination of currents controlled by the controlled current sources $I_{R1}$ and $I_{R2}$, the generation of the differential current outputs $\delta_a$ and the compliment of $\delta_a$, one flowing, to node 6-5 and the other flowing from node 6-6, can be used to compensate fir the coupling current component of the induced magnetic coupling of the inductors $L_1$ and $L_2$ into the inductors $L_3$ and $L_4$ respectively.

Figure 8A:
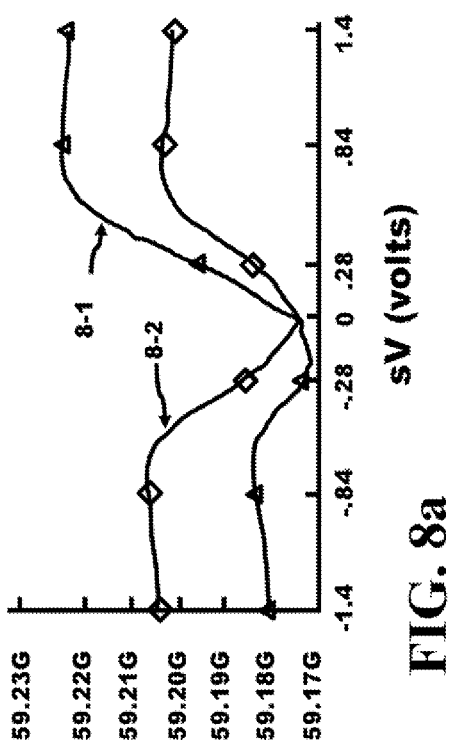
FIG. 8a illustrates depicts the individual I and Q response of the coupled circuit without compensation in accordance with the present invention.

FIG. 8a illustrates the response waveforms to the input of the power amplifier when either the I channel and the Q channel are correspondingly disabled while the other channel is enabled. In the waveform 8-1 only the I channel is enabled, and as indicated by the triangles, the differential signal over a range of frequencies from 59.17 Ghz to 59.23 Ghz is not uniform around the differential voltage of zero. Similarly, when only the Q channel is enabled, the waveform 8-2 indicated by the diamonds shows the differential response from 59.17 Ghz to 59.23 Ghz is not uniform around the differential voltage of zero. These two waveforms are not mirror images of one another based around the point of zero differential voltage. This is due to the coupling effects of inductors $L_1$ and $L_2$ on the inductors $L_3$ and $L_4$, respectively.

Figure 8B:
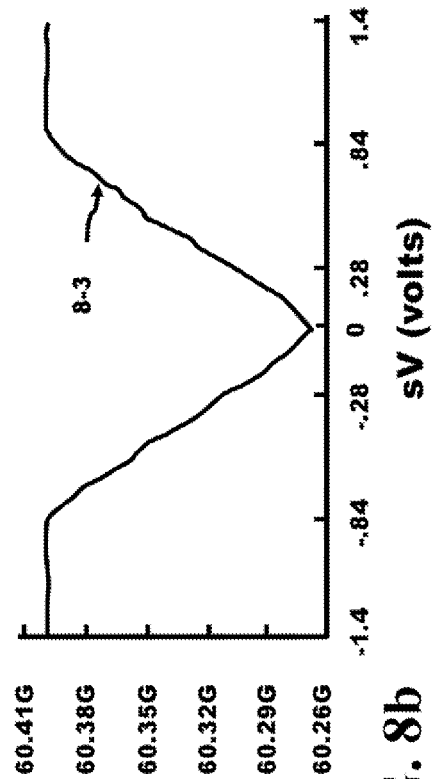
FIG. 8b shows the complete I and Q response of the coupled circuit with compensation in accordance with the present invention.

However when the cancellation circuit is enabled, the total response of the circuit 8-3 is illustrated in FIG. 8b when both the I and Q channels are enabled. In this case, a symmetrical waveform based around the differential voltage of zero for the frequencies ranging from 60.25 Ghz to 60.41 Ghz is indicated showing that the coupling effects of inductors $L_1$ and $L_2$ on the inductors $L_3$ and $L_4$, respectively, has been compensated by the currents of the cancellation circuit.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. This inventive technique is applicable to direct biasing the high frequency design of a mult-stage circuit. The stage can have active electrornics, reactive loads and resistance or any combination therein. It is a challenging layout task to minimize all parasitic inductance and capacitance between, as well within, stages in order to operate the circuit at the smallest possible area in an integrated circuit. As the area is reduced, the inductive coupling is typically increased. The cancellation circuit technique allows the first and second circuits that are magnetically coupled to operate independently of one another. This inventive embodiment offers undesired magnetic coupling cancellation for up-conversion to RF frequencies and down-conversion to IF (Intermediate Frequencies) networks. This allows the RF designer to extend the concept to even higher frequency circuits for a given technology. Many portable wireless systems as well as non-portable systems can benefit from the inventive techniques presented here. In addition, the network and the portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. An apparatus comprising:
   a quadrature oscillator coupled to a power supply by two or more inductors;

a conversion circuit coupled to said power supply by another two or more inductors;
a magnetic coupling between said two or more inductors and said another two or more inductors;
a cancellation circuit responsive to clock signals of said quadrature oscillator;
said cancellation circuit coupled to said conversion circuit and said another two or more inductors to compensate for said magnetic coupling; and
a differential current output of said cancellation circuit introduced into said another two or more inductors that cancels out said magnetic coupling.

2. The apparatus of claim 1, further comprising:
a differential input signal coupled to said conversion circuit.

3. The apparatus of claim 2, further comprising:
two or more mixers coupled to a summer in said conversion circuit which up-converts said differential input signal to a differential RF signal.

4. The apparatus of claim 3, further comprising:
a load coupled to said conversion circuit.

5. The apparatus of claim 4, further comprising:
a power amplifier in said load amplifying said differential RF signal.

6. The apparatus of claim 1, further comprising:
cross coupled circuits in said quadrature oscillator.

7. An apparatus comprising:
a source circuit coupled to a power supply by at least one inductor;
a conversion circuit coupled to said power supply by at least one other inductor;
a magnetic coupling between said one inductor and said other inductor;
a cancellation circuit responsive to at least one output signal from said source circuit;
said cancellation circuit coupled to said other inductor to compensate for said magnetic coupling; and
a current output of said cancellation circuit introduced into said other inductor that cancels said magnetic coupling between said one inductor and said other inductor.

8. The apparatus of claim 7, further comprising:
a differential clock circuit, a differential amplifier or a mixer in said source circuit driven by a first differential input signal.

9. The apparatus of claim 7, further comprising;
a differential input signal coupled to said conversion circuit.

10. The apparatus of claim 9, further comprising:
at least one mixer coupled to a summer in said conversion circuit which either up-converts or down-converts said differential input signal to a differential RF signal or differential IF signal, respectively.

11. The apparatus of claim 10, further comprising:
a load coupled to said conversion circuit.

12. The apparatus of claim 11, further comprising:
an amplifier of said load amplifying said differential RF signal or said differential IF signal.

13. A method of compensating for a magnetic coupling comprising the steps of:
generating signals from a quadrature oscillator coupled to a power supply by two or more inductors;
coupling a conversion circuit to said power supply by another two or more inductors;
magnetically coupling said two or more inductors to said another two or more inductors;
applying, said signals from said quadrature oscillator to a cancellation circuit;
compensating for said magnetic coupling by coupling a differential current of said cancellation circuit to said another two or more inductors;
mixing differential baseband signals with said signals from said quadrature oscillator; and summing said mixed differential baseband signals.

14. The method of claim 13, further comprising the steps of:
applying said summed differential signal to said another two or more inductors.

15. The method of claim 14, thither comprising the steps of:
adding differential currents of said cancellation circuit to said summed differential signal to cancel said magnetic coupling.

16. The method of claim 15, further comprising, the steps of:
amplifying said summed differential signal with a power amplifier.

* * * * *